(12) United States Patent
Choi

(10) Patent No.: US 11,551,996 B2
(45) Date of Patent: Jan. 10, 2023

(54) SEMICONDUCTOR CHIPS AND SEMICONDUCTOR PACKAGES INCLUDING THE SAME

(71) Applicant: Samsung Electronics Co., Ltd., Suwon-si (KR)

(72) Inventor: Dongjoo Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 43 days.

(21) Appl. No.: 17/341,463

(22) Filed: Jun. 8, 2021

(65) Prior Publication Data

US 2022/0115292 A1    Apr. 14, 2022

(30) Foreign Application Priority Data

Oct. 13, 2020    (KR) .......................... 10-2020-0131887

(51) Int. Cl.

| | | |
|---|---|---|
| *H01L 23/38* | (2006.01) | |
| *H01L 25/065* | (2006.01) | |
| *H01L 25/18* | (2006.01) | |
| *H01L 25/00* | (2006.01) | |

(52) U.S. Cl.
CPC .......... *H01L 23/38* (2013.01); *H01L 25/0652* (2013.01); *H01L 25/0657* (2013.01); *H01L 25/18* (2013.01); *H01L 25/50* (2013.01); *H01L 2225/06513* (2013.01); *H01L 2225/06544* (2013.01); *H01L 2225/06586* (2013.01); *H01L 2225/06589* (2013.01)

(58) Field of Classification Search
CPC .. H01L 23/38; H01L 25/0652; H01L 25/0657
See application file for complete search history.

(56) References Cited

U.S. PATENT DOCUMENTS

| | | | |
|---|---|---|---|
| 8,399,269 B2 | 3/2013 | Wang | |
| 2010/0176506 A1 | 7/2010 | Hsu et al. | |
| 2013/0307155 A1* | 11/2013 | Mitsuhashi | ....... H01L 21/76898 257/761 |
| 2015/0115431 A1 | 4/2015 | Chadwick et al. | |

(Continued)

FOREIGN PATENT DOCUMENTS

CN    103794581 A    5/2014

*Primary Examiner* — Thao P Le

(74) *Attorney, Agent, or Firm* — Myers Bigel, P.A.

(57) ABSTRACT

Semiconductor chips may include a substrate; a protective layer on a first surface of the substrate, through electrodes extending through the substrate and the protective layer, and a Peltier structure including first through structures including first conductivity type impurities, and second through structures including second conductivity type impurities, which may extend through the substrate and the protective layer; pads on the protective layer and connected to the through electrodes, respectively, first connection wires connecting respective first ends of the first through structures to respective first ends of the second through structures, and second connection wires connecting respective second ends of the first through structures to respective second ends of one of the second through structures. The first through structures and the second through structures may be alternately connected to each other in series by the first connection wires and the second connection wires.

20 Claims, 24 Drawing Sheets

(56) References Cited

U.S. PATENT DOCUMENTS

| | | | |
|---|---|---|---|
| 2015/0214207 A1* | 7/2015 | Yoshida | H01L 24/81 438/109 |
| 2016/0035705 A1* | 2/2016 | Watanabe | H01L 23/481 438/109 |
| 2017/0033144 A1* | 2/2017 | Takahashi | H01L 27/14638 |
| 2017/0207141 A1 | 7/2017 | Fisch | |
| 2018/0174941 A1 | 6/2018 | Son | |
| 2018/0211943 A1* | 7/2018 | Song | H01L 23/13 |
| 2020/0006325 A1 | 1/2020 | Lee et al. | |
| 2020/0043853 A1* | 2/2020 | Kim | H01L 24/81 |
| 2020/0219961 A1* | 7/2020 | Managaki | H01L 27/3248 |
| 2021/0111140 A1* | 4/2021 | Jang | H01L 24/73 |
| 2021/0143116 A1* | 5/2021 | Hong | H01L 21/563 |
| 2021/0375997 A1* | 12/2021 | Nakamura | H04N 5/369 |
| 2022/0059519 A1* | 2/2022 | Lee | H01L 24/19 |

\* cited by examiner

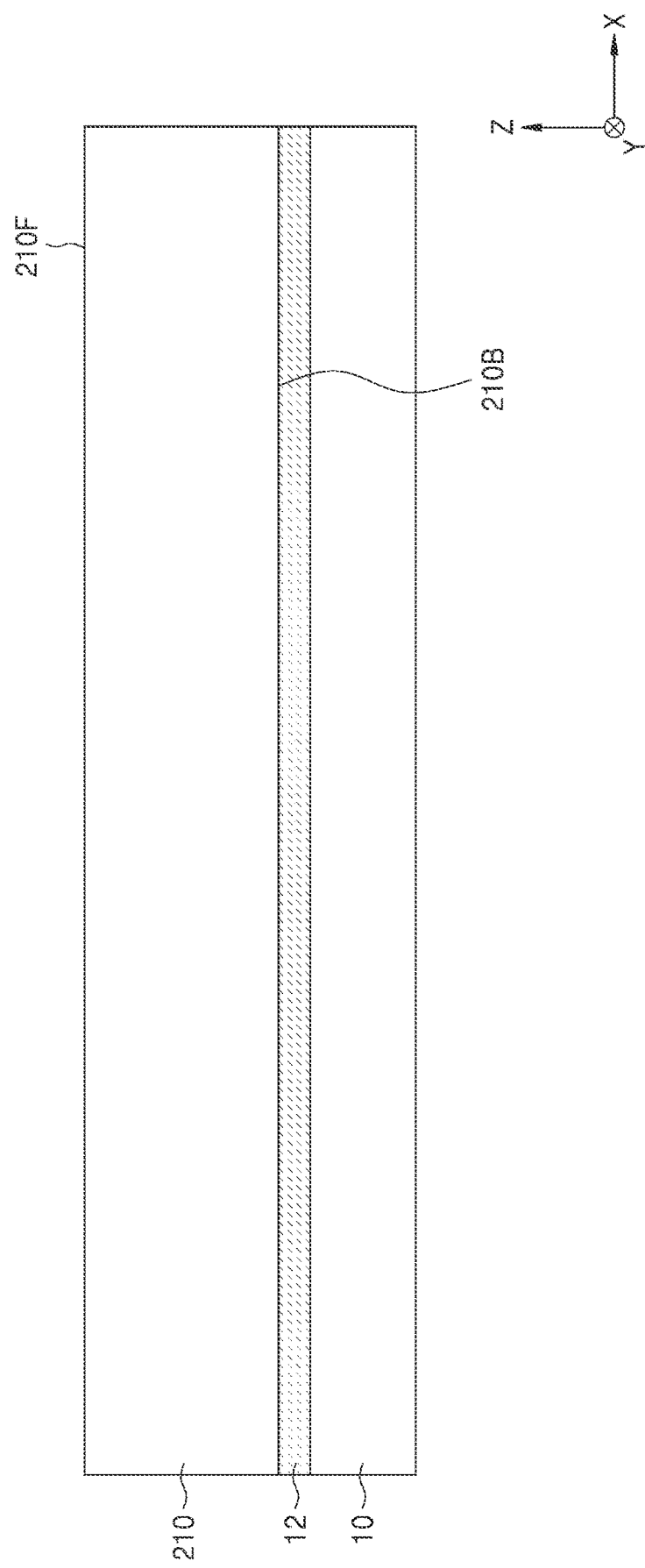

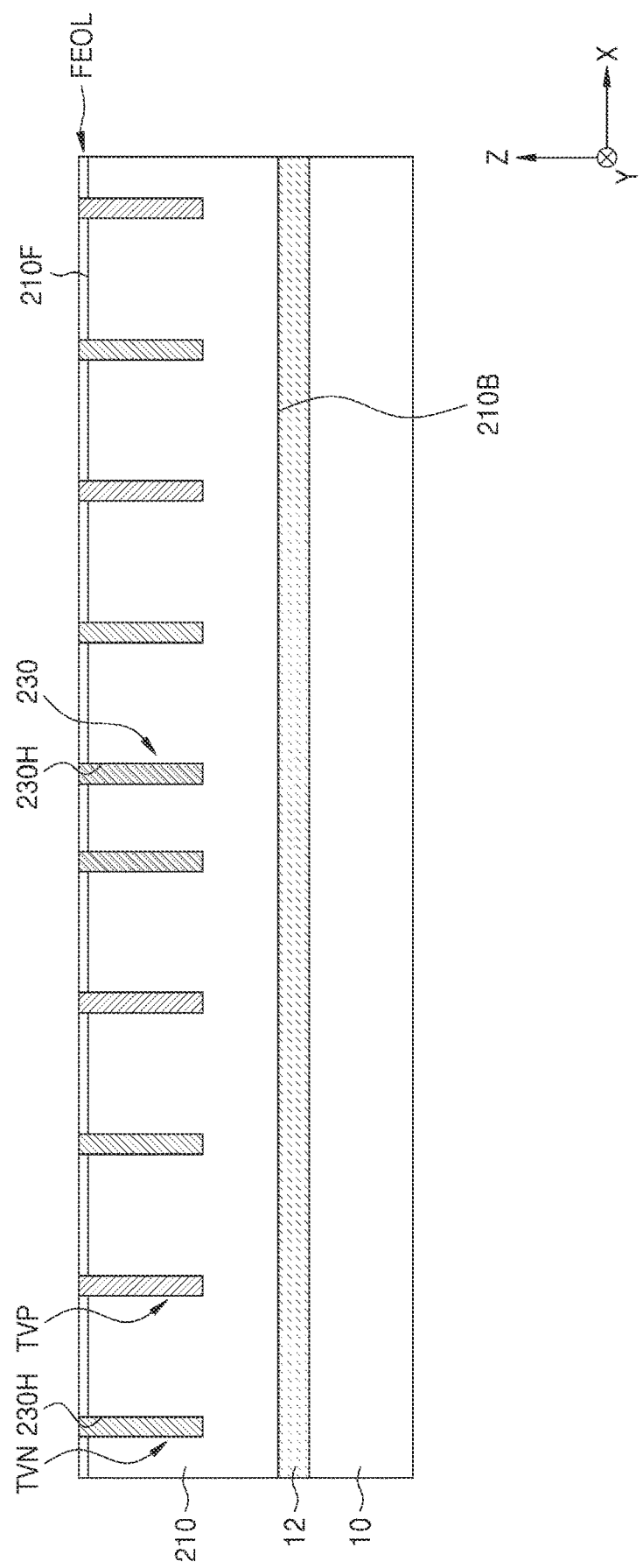

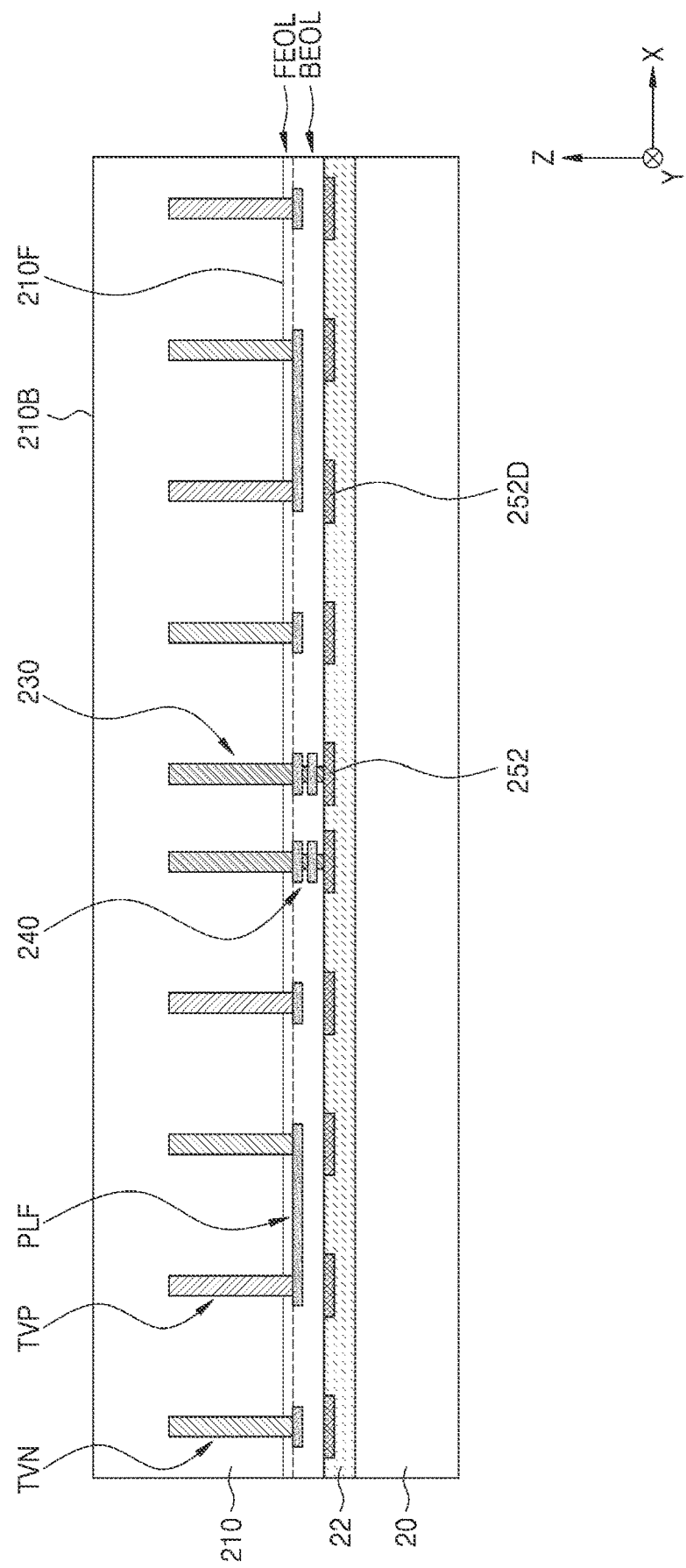

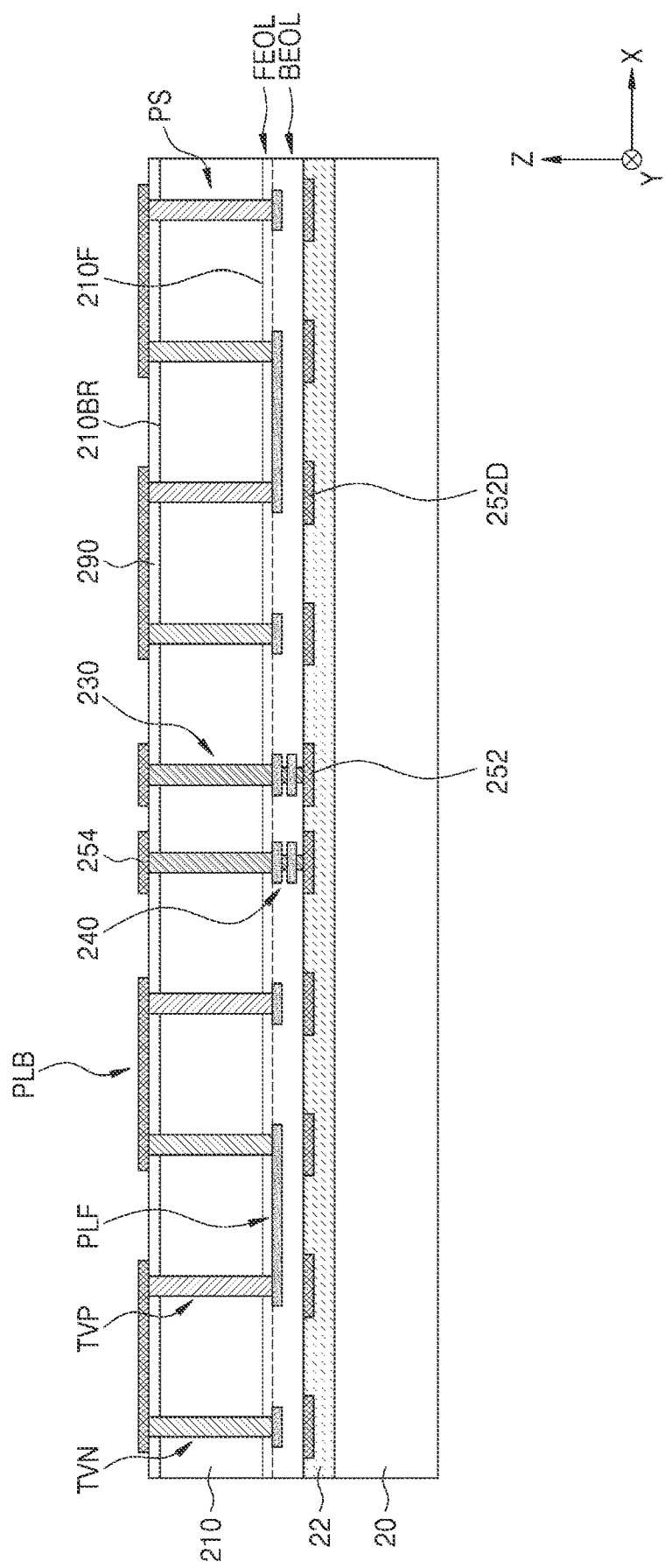

SEMICONDUCTOR CHIPS AND SEMICONDUCTOR PACKAGES INCLUDING THE SAME

CROSS-REFERENCE TO RELATED APPLICATION

This application is based on and claims priority under 35 U.S.C. § 119 to Korean Patent Application No. 10-2020-0131887, filed on Oct. 13, 2020, in the Korean Intellectual Property Office, the disclosure of which is incorporated by reference herein in its entirety.

BACKGROUND

The inventive concept relates to a semiconductor chip, a stacked semiconductor chip structure, and a semiconductor package, and more particularly, to a semiconductor chip including through electrodes and a stacked semiconductor chip structure and a semiconductor package including the same.

To manufacture electronic devices having small sizes and high performance and being capable of performing multiple functions, semiconductor packages including semiconductor chips are being developed. However, a size of a semiconductor package may increase as a number of semiconductor chips included in the semiconductor package increases. A stacked semiconductor chip structure that includes stacked semiconductor chips including through electrodes and a semiconductor package including the stacked semiconductor chip structure has been researched to reduce a size of a semiconductor package.

SUMMARY

Example embodiments of the inventive concept provide semiconductor chips including through electrodes with improved reliability, a stacked semiconductor chip structure, and a semiconductor package including the same.

Example embodiments of the inventive concept provide semiconductor chips as follows.

According to some embodiments of the inventive concept, semiconductor chips may include: a semiconductor substrate; a protective layer (e.g., a rear protective layer) extending on (e.g., covering) a first surface (e.g., an inactive surface) of the semiconductor substrate; a plurality of through electrodes extending through the semiconductor substrate and the protective layer; and a Peltier structure including: a plurality of first through structures including first impurities having a first conductivity type, and a plurality of second through structures including second impurities having a second conductivity type that is different from the first conductivity type, which may extend through or penetrate the semiconductor substrate and the protective layer; a plurality of pads (e.g., a plurality of rear pads) arranged on the protective layer and connected to the plurality of through electrodes, respectively; a plurality of first connection wires connecting respective first ends of the plurality of first through structures to respective first ends of the plurality of second through structures; and a plurality of second connection wires connecting respective second ends of the plurality of first through structures to respective second ends of the plurality of second through structures. The plurality of first through structures and the plurality of second through structures may be alternately connected to each other in series by the plurality of first connection wires and the plurality of second connection wires. The protective layer may extend between the plurality of pads and the first surface of the semiconductor substrate.

According to some embodiments of the inventive concept, stacked semiconductor chip structures may include: a first semiconductor chip; and at least one second semiconductor chip on the first semiconductor chip, wherein each of the first semiconductor chip and the at least one second semiconductor chip may include: a semiconductor substrate; a protective layer (e.g., a rear protective layer) extending on (e.g., covering) covering a first surface (e.g., an inactive surface) of the semiconductor substrate; a plurality of through electrodes extending through the semiconductor substrate and the protective layer; and a Peltier structure including: a plurality of first through structures including first impurities having a first conductivity type and a plurality of second through structures including second impurities having a second conductivity type that is different from the first conductivity type, which may extend through or penetrate the semiconductor substrate and the protective layer; a plurality of rear pads on the protective layer and connected to the plurality of through electrodes, respectively; a plurality of first connection wires connecting respective first ends of the plurality of first through structures to respective first ends of the plurality of second through structures; and a plurality of second connection wires connecting respective second ends of the plurality of first through structures to respective second ends of the plurality of second through structures, wherein the plurality of first through structures and the plurality of second through structures may be alternately connected to each other in series by the plurality of first connection wires and the plurality of second connection wires to form a Peltier structure, and the Peltier structure included in the first semiconductor chip and the Peltier structure included in the at least one second semiconductor chip may be connected in parallel to each other.

According to some embodiments of the inventive concept, semiconductor packages may include: an interposer; a stacked semiconductor chip structure attached to a first surface of the interposer and including a first semiconductor chip and a second semiconductor chip sequentially stacked on the interposer; and a third semiconductor chip that is attached to the first surface of the interposer and spaced apart from the stacked semiconductor chip structure. Each of the first semiconductor chip and the at least one second semiconductor chip may include a semiconductor substrate; a protective layer (e.g., a rear protective layer) extending on a first surface (e.g., an inactive surface) of the semiconductor substrate; a front end of line (FEOL) layer on a second surface (e.g., an active surface) of the semiconductor substrate, the second surface of the semiconductor substrate being opposite the first surface of the semiconductor substrate; a back end of line (BEOL) layer including a wiring structure that may include a plurality of wiring patterns, the FEOL layer extending between the second surface of the semiconductor substrate and the BEOL layer, and the plurality of wiring patterns respectively including a plurality of first wiring patterns that are closest to the semiconductor substrate; a plurality of through electrodes extending through or penetrating the FEOL layer, the semiconductor substrate, and the rear protective layer and including respective first ends respectively connected to the plurality of first wiring patterns; a plurality of pads connected to respective second ends of the plurality of through electrodes, the protective layer extending between the first surface of the semiconductor substrate and the plurality of pads; and a Peltier structure including: a plurality of first through structures including first impurities having a first conductivity type and a plurality of second through structures including second impurities having a second conductivity type that is different from the first conductivity type; a plurality of pads (e.g., a plurality of rear pads) on the protective layer and connected to the other ends of the plurality of through electrodes; a plurality of first connection wires connecting respective first ends of the plurality of first through structures to respective first ends of the plurality of second through structures, the plurality of first connection wires and the plurality of first wiring patterns being spaced apart from the second surface of the semiconductor substrate by an equal distance; and a plurality of second connection wires connecting respective second ends of the plurality of first through structures to respective second ends of the plurality of second through structures, the plurality of second connection wires and the plurality of rear pads being spaced apart from the first surface of the semiconductor substrate by an equal distance. The plurality of first through structures and the plurality of second through structures may be alternately connected to each other in series by the plurality of first connection wires and the plurality of second connection wires.

BRIEF DESCRIPTION OF THE DRAWINGS

Embodiments of the inventive concept will be more clearly understood from the following detailed description taken in conjunction with the accompanying drawings in which:

FIGS. 9A to 9I are cross-sectional views illustrating methods of manufacturing a semiconductor chip according to some embodiments of the inventive concept.

DETAILED DESCRIPTION

Figure 1A:
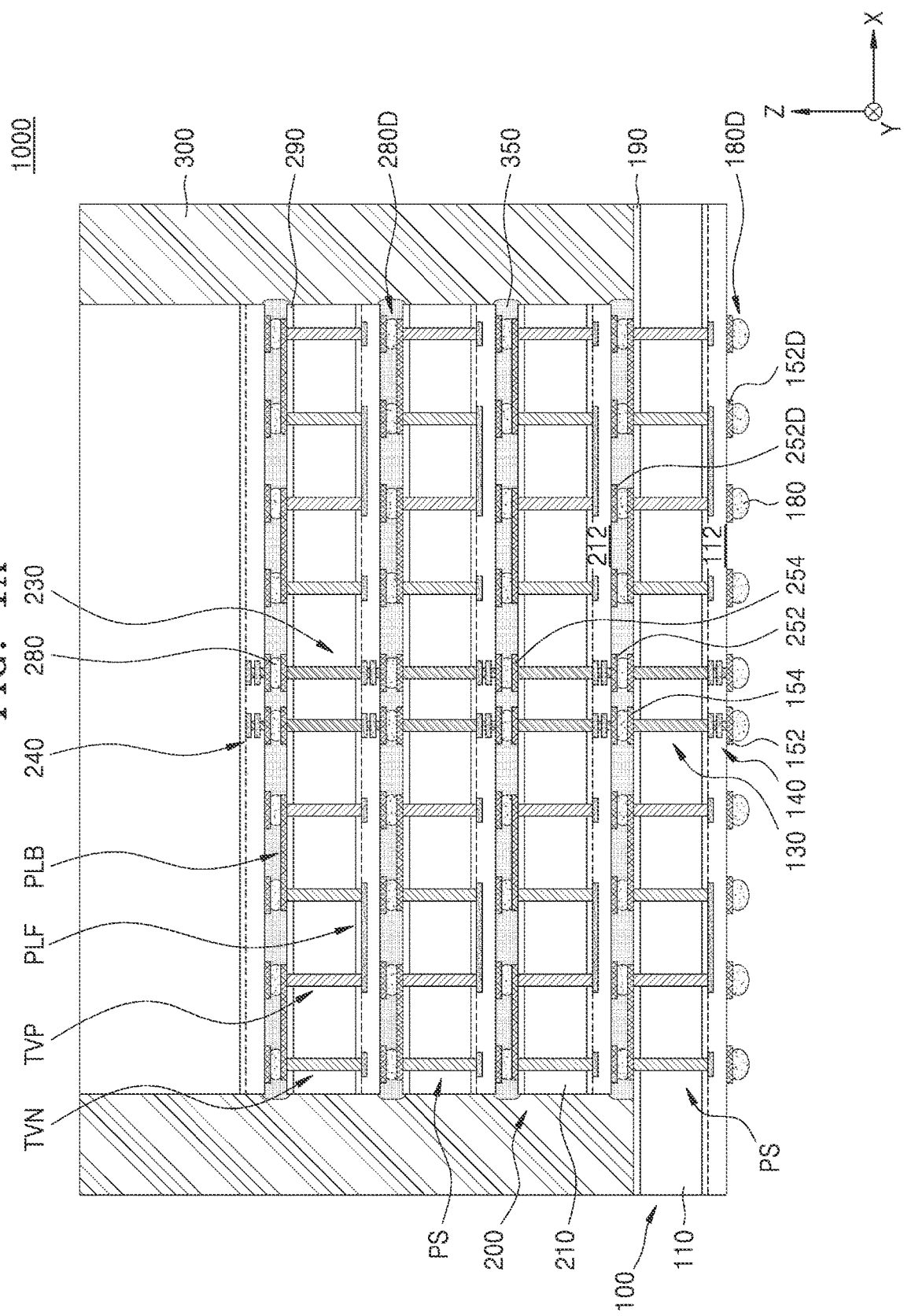
FIG. 1A is a cross-sectional view illustrating a stacked semiconductor chip structure in which semiconductor chips are stacked according to some embodiments of the inventive concept.
Figure 1B:
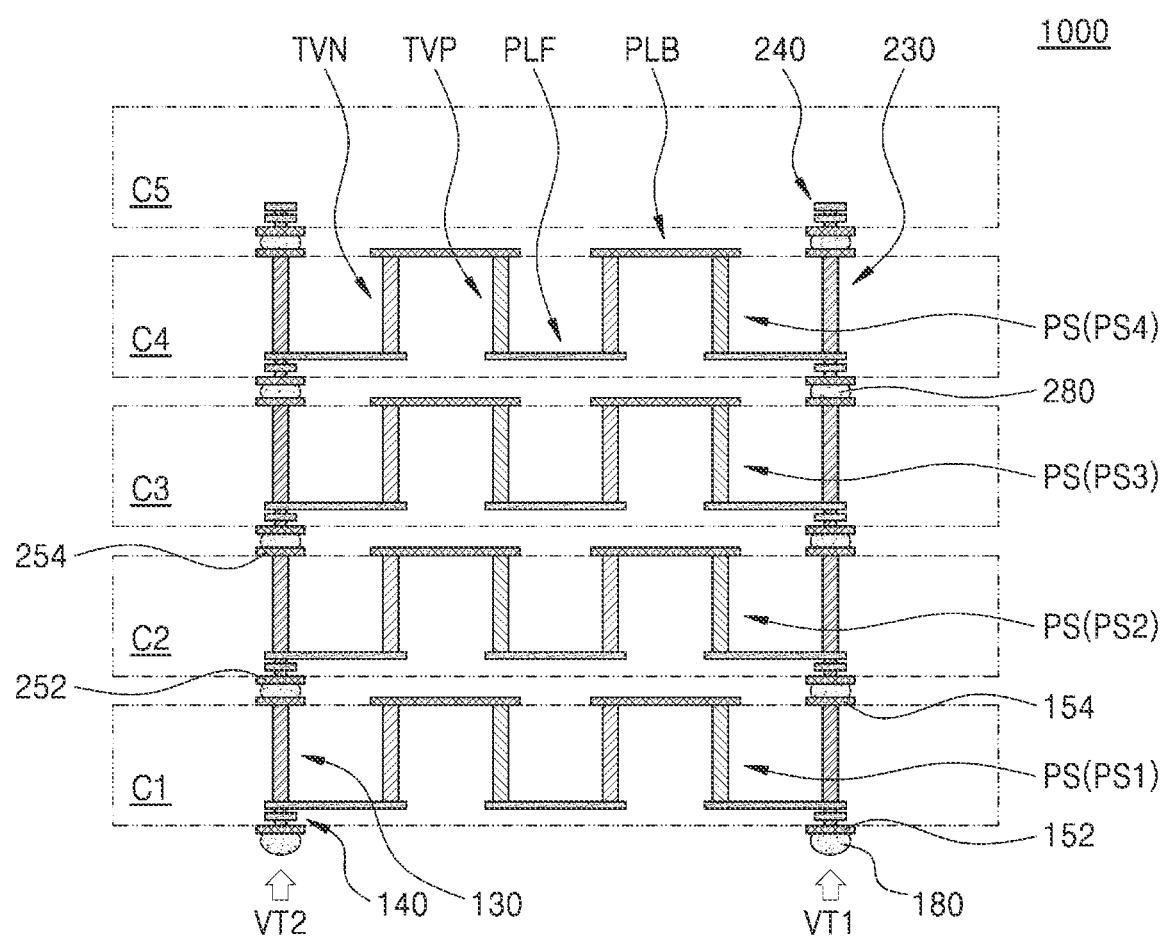
FIG. 1B is a schematic diagram illustrating an electrical connection between Peltier structures of the semiconductor chips included in the stacked semiconductor chip structure shown in FIG. 1A according to some embodiments of the inventive concept.

FIG. 1A is a cross-sectional view illustrating a stacked semiconductor chip structure in which semiconductor chips are stacked according to some embodiments of the inventive concept, and FIG. 1B is a schematic diagram illustrating an electrical connection between Peltier structures of the semiconductor chips included in the stacked semiconductor chip structure shown in FIG. 1A according to some embodiments of the inventive concept.

Referring to FIG. 1A, a stacked semiconductor chip structure 1000 includes a first semiconductor chip 100 and a plurality of second semiconductor chips 200. In FIGS. 1A and 1B, the stacked semiconductor chip structure 1000 is illustrated as including four second semiconductor chips 200, but the inventive concept is not limited thereto. For example, the stacked semiconductor chip structure 1000 may include two or more second semiconductor chips 200. In some embodiments, the stacked semiconductor chip structure 1000 may include a multiple of four second semiconductor chips 200. The plurality of second semiconductor chips 200 may be stacked on the first semiconductor chip 100. The stacked semiconductor chip structure 1000 may be referred to as a sub-semiconductor package.

The first semiconductor chip 100 may include a first semiconductor substrate 110, a first semiconductor device 112 that is formed on an active surface of the first semiconductor substrate 110, a first wiring structure 140 formed on the active surface of the first semiconductor substrate 110, and a plurality of first through electrodes 130 connected to the first wiring structure 140 and penetrating at least a portion of the first semiconductor chip 100.

In the stacked semiconductor chip structure 1000, the first semiconductor chip 100 may be arranged such that the active surface of the first semiconductor substrate 110 faces downward and an inactive surface thereof faces upward. Unless otherwise stated in the specification, an upper surface of the first semiconductor chip 100 of the stacked semiconductor chip structure 1000 refers to a side facing the second semiconductor chips 200, and a lower surface of the first semiconductor chip 100 of the stacked semiconductor chip structure 1000 refers a side opposite the upper surface of the first semiconductor chip 100. However, when describing the first semiconductor chip 100 as a reference, the lower surface of the first semiconductor chip 100 adjacent to the active surface of the first semiconductor substrate 110 may be referred to as a front surface of the first semiconductor chip 100, and an upper surface of the first semiconductor chip 100 adjacent to the inactive surface may be referred to as a rear surface of the first semiconductor chip 100.

A second semiconductor chip 200 may include a second semiconductor substrate 210, a second semiconductor device 212 that is formed on an active surface of the second semiconductor substrate 210, and a second wiring structure 240 formed on the active surface of the second semiconductor substrate 210.

The second semiconductor chip 200 may further include a plurality of second through electrodes 230 connected to the second wiring structure 240 and penetrating at least a portion of the second semiconductor chip 200. In some embodiments, among the plurality of second semiconductor chips 200, the second semiconductor chip 200 located farthest from the first semiconductor chip 100 may not include a second through electrode 230. In some embodiments, among the plurality of second semiconductor chips 200, the second semiconductor chip 200 located farthest from the first semiconductor chip 100 may have a thickness greater than that of the other second semiconductor chips 200 as illustrated in FIG. 1A.

In the stacked semiconductor chip structure 1000, the plurality of second semiconductor chips 200 may be sequentially stacked on the first semiconductor chip 100 in a vertical direction (Z direction) each with an active surface facing downward. Unless otherwise stated in the specification, a lower surface of the second semiconductor chip 200 of the stacked semiconductor chip structure 1000 refers to a side facing the first semiconductor chip 100, and an upper surface of the second semiconductor chip 200 of the stacked semiconductor chip structure 1000 refers to a side opposite the lower surface of the second semiconductor chip 200. However, when describing the second semiconductor chip 200 as a reference, the lower surface of the second semiconductor chip 200 adjacent to the active surface of the second semiconductor substrate 210 may be referred to as a front surface of the second semiconductor chip 200, and the upper surface of the second semiconductor chip 200 adjacent to the inactive surface of the second semiconductor substrate 210 may be referred to as a rear surface of the second semiconductor chip 200.

The first semiconductor substrate 110 and the second semiconductor substrate 210 may include, for example, a semiconductor material such as silicon (Si). In some embodiments, the first semiconductor substrate 110 and the second semiconductor substrate 210 may include a semiconductor material such as germanium (Ge). In some embodiments, the first and second semiconductor substrates 110 and 210 may include compound semiconductors such as silicon carbide (SiC), gallium arsenide (GaAs), indium arsenide (InAs), and/or indium phosphide (InP). Each of the first and second semiconductor substrates 110 and 210 may have an active surface and an inactive surface opposite to the active surface. The first and second semiconductor substrates 110 and 210 may include a conductive area, for example, a well doped with impurities. The first semiconductor substrate 110 and the second semiconductor substrate 210 may have various device isolation structures such as a shallow trench isolation (STI) structure. As used herein the term "and/or" includes any and all combinations of one or more of the associated listed items.

Each of the first semiconductor device 112 and the second semiconductor device 212 may include a plurality of individual devices of various types. The individual devices may include various microelectronic devices, for example, a metal-oxide-semiconductor field effect transistor (MOSFET) such as a complementary metal-insulator-semiconductor (CMOS) transistor, an image sensor such as system large scale integration (LSI) and a CMOS imaging sensor (CIS), a micro-electro-mechanical system (MEMS), an active device, and/or a passive device. The plurality of individual devices may be electrically connected to the conductive area of the first semiconductor substrate 110 or the second semiconductor substrate 210. Each of the first semiconductor device 112 and the second semiconductor device 212 may further include a conductive wire or a conductive plug electrically connecting at least two of the plurality of individual elements, or the plurality of individual devices and the conductive area of each of the first and second semiconductor substrates 110 and 210. Furthermore, the individual devices may be electrically insulated from other neighboring individual devices by an insulating film, respectively.

The first semiconductor chip 100 and the second semiconductor chip 200 may be, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip. The first semiconductor chip 100 and the second semiconductor chip 200 may be, for example, a central processing unit (CPU) chip, a graphics processing unit (GPU) chip, or an application processor (AP) chip.

In some embodiments, the stacked semiconductor chip structure 1000 including the first semiconductor chip 100 and the plurality of second semiconductor chips 200 may be referred to as a high bandwidth memory (HBM) DRAM semiconductor chip. For example, the first semiconductor chip 100 includes a serial-parallel conversion circuit and may be a buffer chip for controlling the plurality of second semiconductor chips 200, and the plurality of second semiconductor chips 200 may be core chips including DRAM memory cells. In some embodiments, the first semiconductor chip 100 may be referred to as a master chip, and each of the plurality of second semiconductor chips 200 may be referred to as a slave chip.

The first wiring structure 140 and the second wiring structure 240 may include, for example, a metal material such as aluminum, copper, or tungsten. In some embodiments, the first wiring structure 140 and the second wiring structure 240 may include a barrier layer for wiring and a metal layer for wiring. The barrier layer for wiring may include, for example, a nitride or oxide of a metal such as titanium (Ti), tantalum (Ta), ruthenium (Ru), manganese (Mn), cobalt (Co), or tungsten (W), or an alloy such as CoWBP (Cobalt Tungsten Boron Phosphide), CoWP (Cobalt Tungsten Phosphide), or CoWB (Cobalt Tungsten Boron). The metal layer for wiring may include at least one metal selected from W, aluminum (Al), Ti, Ta, Ru, Mn, or copper (Cu).

Each of the first wiring structure 140 and the second wiring structures 240 may include a plurality of wiring patterns extending on a horizontal plane (X-Y plane) and a plurality of wiring vias connected to the plurality of wiring patterns and extending in the vertical direction (Z direction). In some embodiments, each of the first wiring structure 140 and the second wiring structures 240 may include a multilayer wiring structure having the wiring patterns and the wiring vias at different vertical levels. In some embodiments, when the first wiring structure 140 and the second wiring structure 240 are multilayer wiring structures, an inter-wire insulating layer surrounding the first wiring structure 140 and the second wiring structure 240 may have a multilayer structure in which a plurality of insulating layers are stacked corresponding to a multilayer wiring structure of each of the first wiring structure 140 and the second wiring structure 240.

For the wiring patterns and the wiring vias, in FIG. 3B, wiring patterns M1 and M2 forming the second wiring structure 240 and wiring vias VA1 and VA2 will be described in more detail.

The first semiconductor chip 100 may further include a first rear protective layer 190 covering an inactive surface of the first semiconductor substrate 110. Each of the plurality of second semiconductor chips 200 may further include a second rear protective layer 290 covering the inactive surface of the second semiconductor substrate 210. In some embodiments, among the plurality of second semiconductor chips 200, the second semiconductor chip 200 located farthest from the first semiconductor chip 100 may not include the second rear protective layer 290. As used herein, an element or region that is "covering" or "surrounding" or "filling" another element or region may completely or partially cover or surround or fill the other element or region.

The first rear protective layer 190 and the second rear protective layer 290 may include, for example, an oxide, a nitride, a polymer, or a combination thereof. In some embodiments, the first rear protective layer 190 and the second rear protective layer 290 may include a polymer formed by a spin coating process or a spray process. In some other embodiments, the first rear protective layer 190 and the second rear protective layer 290 may include an oxide or nitride, or a combination thereof formed by a deposition process.

Each of the plurality of first through electrodes 130 is connected to the first wiring structure 140 and may penetrate the first semiconductor substrate 110 and the first rear protective layer 190 and may extend in the vertical direction (Z direction) to the upper surface of the first semiconductor chip 100, that is, the rear surface of the first semiconductor chip 100. Each of the plurality of second through electrodes 230 is connected to the second wiring structure 240 and may penetrate the second semiconductor substrate 210 and the second rear protective layer 290 and may extend in the vertical direction (Z direction) to the upper surface of the first semiconductor chip 200, that is, the rear surface of the first semiconductor chip 200.

The first through electrode 130 and the second through electrode 230 may include a through silicon via (TSV). Each of the first through electrode 130 and the second through electrodes 230 may include a conductive plug penetrating each of the first semiconductor substrate 110 and the second semiconductor substrate 210 and a conductive barrier layer surrounding the conductive plug. The conductive plug may have a cylindrical shape, and the conductive barrier layer may have a cylindrical shape surrounding a sidewall of the conductive plug. A via insulating layer may be between the first through electrode 130 and the first semiconductor substrate 110 and may be between the second through electrode 230 and the second semiconductor substrate 210 to surround sidewalls of the first through electrode 130 and the second through electrode 230. The first through electrode 130 and the second through electrode 230 may be formed in any one of a via-first, via-middle, and via-last structure.

The conductive plug may include, for example, Cu or W. For example, the conductive plug may include Cu, CuSn, CuMg, CuNi, CuZn, CuPd, CuAu, CuRe, CuW, W, or a W alloy, but the inventive concept is not limited thereto. For example, the conductive barrier layer may include, but is not limited to, one or more of Al, Au, Be, Bi, Co, Cu, Hf, In, Mn, Mo, Ni, Pb, Pd, Pt, Rh, Re, Ru, Ta, Te, Ti, W, Zn, and Zr and may include one or more stacked structures. In some embodiments, the conductive barrier layer may include at least one material selected from W, WN, WC, Ti, TiN, Ta, TaN, Ru, Co, Mn, WN, Ni, and NiB and may include a single layer or multiple layers. The conductive plug and the conductive barrier layer may be formed by, for example, a physical vapor deposition (PVD) process or a chemical vapor deposition (CVD) process, but the inventive concept is not limited thereto. The via insulating layer may include, for example, an oxide layer, a nitride layer, a carbide layer, a polymer, or a combination thereof. In some embodiments, the via insulating layer may be formed by a CVD process. For example, the via insulating layer may include an O$_3$/TEOS-based high aspect ratio process (HARP) oxide layer formed by a sub-atmospheric CVD process.

A plurality of first front pads 152 may be arranged on the lower surface of the first semiconductor chip 100, that is, the front surface of the first semiconductor chip 100, and a plurality of second front pads 252 may be arranged on the lower surface of the second semiconductor chip 200, that is, the front surface of the second semiconductor chip 200. For example, each of the plurality of first front pads 152 and the plurality of second front pads 252 may include copper, nickel, stainless steel, or a copper alloy such as beryllium copper.

A plurality of first connection bumps 180 may be respectively attached on the plurality of first front pads 152, and a plurality of second connection bumps 280 may be respectively attached on the plurality of second front pads 252. For example, each of the first connection bumps 180 and the second connection bumps 280 may include Cu, Al, silver (Ag), tin (Sn), gold (Au), or solder. In some embodiments, each of the first connection bumps 180 and the second connection bumps 280 may include a conductive pillar and a conductive cap covering the conductive pillar. The conductive pillar may have a thickness of about 3 μm to about 5 μm and a width of about 10 μm to about 20 μm. The conductive cap may have a thickness of about 10 μm to about 15 μm and a width of about 15 μm to about 25 μm. For example, the conductive pillar may include at least one of nickel, copper, titanium, palladium, platinum, and gold. In some embodiments, the conductive pillar may include nickel. In some other embodiments, the conductive pillar may have a multilayer structure including a barrier layer, a seed layer, and a base pillar layer. For example, each of the barrier layer, the seed layer, and the base pillar layer may include titanium, copper, and nickel. For example, the conductive cap may include at least one of Sn, indium (In), bismuth (Bi), antimony (Sb), Cu, Ag, Au, zinc (Zn), and lead (Pb). In some embodiments, the conductive cap may include SnAg. As used herein, a thickness is a thickness in a Z direction, and a width is a width in a X direction or a Y direction.

Some of the plurality of first front pads 152 may be electrically connected to the plurality of first through electrodes 130 through the first wiring structure 140, and some others of the plurality of first front pads 152 may not be electrically connected to the first through electrode 130. Among the plurality of first front pads 152, a first front pad 152 that is not electrically connected to the first through electrode 130 may be referred to as a first dummy front pad 152D. Among the plurality of first front pads 152, a first front pad 152 electrically connected to the first through electrode 130 may be referred to as a first signal front pad. In some embodiments, among the plurality of first front pads 152, a first front pad 152 other than the first dummy front pad 152D may be the first signal front pad.

The plurality of first connection bumps 180 may be respectively attached on the plurality of first front pads 152. Among the plurality of first connection bumps 180, a first connection bump 180 attached to the first dummy front pad 152D may be referred to as a first dummy connection bump 180D, a first connection bump 180 attached to the first signal front pad may be referred to as a first signal connection bump.

Some of the plurality of second front pads 252 may be electrically connected to the plurality of second through electrodes 230 through the second wiring structure 240, and some others of the plurality of second front pads 252 may not be electrically connected to the second through electrode 230 in the second semiconductor chip 200. A second front pad 252 not electrically connected to the second through electrode 230 in the second semiconductor chip 200 from among the plurality of second front pads 252 may be referred to as a second dummy front pad 252D. Among the plurality of second front pads 252, a second front pad 252 electrically connected to the second through electrode 230 may be referred to as a second signal front pad. In some embodiments, among the plurality of second front pads 252, a second front pad 252 other than the second dummy front pad 252D may be the second signal front pad.

The plurality of second connection bumps 280 may be respectively attached on the plurality of second front pads 252. Among the plurality of second connection bumps 280, a second connection bump 280 attached to the second dummy front pad 252D may be referred to as a second dummy connection bump 280D, and a second connection bump 280 attached to the second signal front pad may be referred to as a second signal connection bump.

FIG. 1A shows that each of a plurality of second dummy connection bumps 280D is between the second dummy front pad 252D and a second connection wire PLB to be described later, but the inventive concept is not limited thereto. In some embodiments, at least some of the plurality of second dummy connection bumps 280D may be between a first dummy rear pad formed with a first rear pad 154 or a second rear pad 254 or a second dummy rear pad and the second connection wire PLB.

Each of the first signal connection bump and the second signal connection bump may provide at least one of a signal, power, or ground for the first and second semiconductor chips 100 and 200, and the first dummy connection bump 180D and the second dummy connection bump 280D may dissipate heat generated by the first and second semiconductor chips 100 and 200 to the outside without providing signal, power, and ground.

A plurality of first rear pads 154 may be arranged on the upper surface of the first semiconductor chip 100, that is, the rear surface of the first semiconductor chip 100, and a plurality of second rear pads 254 may be arranged on the upper surface of the second semiconductor chip 200, that is, the rear surface of the second semiconductor chip 200. The plurality of first rear pads 154 may be on the first rear protective layer 190, and the plurality of second rear pads 254 may be on the second rear protective layer 290. In some embodiments, among the plurality of second semiconductor chips 200, the second rear pad 254 may not be arranged on the rear surface of the second semiconductor chip 200 located farthest from the first semiconductor chip 100.

The first rear pad 154 and the second rear pad 254 may have a thickness of about 2 µm to about 4 µm and a width of about 15 µm to about 25 µm. For example, the first rear pad 154 and the second rear pad 254 may include at least one of nickel, copper, titanium, palladium, platinum, and gold. In some embodiments, the first rear pad 154 and the second rear pad 254 may include nickel.

The plurality of first rear pads 154 may be connected to the plurality of first through electrodes 130, and the plurality of second rear pads 254 may be connected to the plurality of second through electrodes 230. In some embodiments, the first through electrode 130 may extend from the first wiring structure 140 to the first rear pad 154, and the second through electrode 230 may extend from the second wiring structure 240 to the second rear pad 254. In some embodiments, the first through electrode 130 may contact both the first wiring structure 140 and the first rear pad 154, and the second through electrode 230 may contact both the second wiring structure 240 and the second rear pad 254 as illustrated in FIG. 1A.

The second signal connection bump among the plurality of second connection bumps 280 may be between a second signal connection pad in the plurality of second front pads 252 of a second semiconductor chip 200 that is closest to the first semiconductor chip 100, which may be refereed to as a lowest second semiconductor chip 200, and the first rear pad 154 or may be between a second signal connection pad in the plurality of second front pads 252 of a second semiconductor chip 200 other than the lowest second semiconductor chip 200 and the second rear pad 254 of the lowest second semiconductor chip 200.

An insulating adhesive layer 350 may be between the first semiconductor chip 100 and each of the plurality of second semiconductor chips 200. The insulating adhesive layer 350 may include, for example, a non-conductive film (NCF), a non-conductive paste (NCP), an insulating polymer, and/or an epoxy resin. The insulating adhesive layer 350 may surround the plurality of first connection bumps 280 and fill between each of the first semiconductor chip 100 and the plurality of second semiconductor chips 200.

In some embodiments, the width of the first semiconductor chip 100 may be greater than the width of each of the plurality of second semiconductor chips 200 as illustrated in FIG. 1A. The stacked semiconductor chip structure 1000 may further include a molding layer 300 surrounding side surfaces of the plurality of second semiconductor chips 200 and side surfaces of the insulating adhesive layer 350 on the first semiconductor chip 100. The molding layer 300 may include, for example, an epoxy mold compound (EMC).

Each of the first semiconductor chip 100 and the plurality of second semiconductor chips 200 may include a Peltier structure PS. In some embodiments, among the plurality of second semiconductor chips 200, the second semiconductor chip 200 located farthest from the first semiconductor chip 100 may not include a Peltier structure PS. The Peltier structure PS may be formed by alternately connecting a plurality of first through structures TVP to a plurality of second through structures TVN in series. The plurality of first through structures TVP and the plurality of second through structures TVN extending in the vertical direction (Z direction) may be alternately connected to each other in series by a first connection wire PLF and the second connection wire PLB extending on the horizontal plane (X-Y plane) to form the Peltier structure PS. The first connection wire PLF may connect one of the plurality of first through structures TVP to one of the plurality of second through structures TVN. The second connection wire PLB may connect one of the plurality of first through structures TVP to one of the plurality of second through structures TVN. For example, one of the plurality of first through structures TVP may be connected to one of the plurality of second through structures TVN through one of a plurality of first connection wires PLF, and may be connected to the other one of the plurality of second through structures TVN through one of a plurality of second connection wires PLB. For example, one of the plurality of second through structures TVN may be connected to one of the plurality of first through structures TVP through one of the plurality of first connection wires PLF, and may be connected to the other one of the plurality of first through structures TVP through one of the plurality of second connection wires PLB.

In some embodiments, the Peltier structure PS included in the first semiconductor chip 100 and the Peltier structure PS included in the second semiconductor chip 200 may have substantially the same structure as each other, and thus the Peltier structures PS may be described together except for cases where separate descriptions are required.

In some embodiments, the first connection wire PLF may be formed together with a plurality of wiring patterns included in the first wiring structure 140 or the second wiring structure 240. For example, in the Peltier structure PS included in the first semiconductor chip 100, the first connection wire PLF may be formed together with at least some of the plurality of wiring patterns included in the first wiring structure 140, and in the Peltier structure PS included in the second semiconductor chip 200, the first connection wire PLF may be formed together with at least some of the plurality of wiring patterns included in the second wiring structure 240. For example, the first connection wire PLF may include the same material, may have the same thickness, and may be at the same vertical level as at least a portion of a plurality of wiring patterns of the first wiring structure 140 or at least a portion of a plurality of wiring patterns of the second wiring structure 240. As used herein, "an element A being formed together with an element B" may mean that the element A and the element B are formed by same processes.

In some embodiments, the second connection wire PLB may be formed together with the first rear pad 154 or the second rear pad 254. For example, the second connection wire PLB may include the same material, may have the same thickness, and may be at the same vertical level as the first rear pad 154 or the second rear pad 254.

The plurality of first through structures TVP and the plurality of second through structures TVN may be at the same vertical level as the plurality of first through electrodes 130 or the plurality of second through electrodes 230. For example, vertical heights of the plurality of first through structures TVP and the plurality of second through structures TVN in the first semiconductor chip 100 may be the same as vertical heights of the plurality of first through electrodes 130, and vertical heights of the plurality of first through structures TVP, and the plurality of second through structures TVN in the second semiconductor chip 200 may be the same as vertical heights of the plurality of second through electrodes 230. For example, vertical levels of the uppermost and lowermost ends of the plurality of first through structures TVP and the plurality of second through structures TVN may be the same as vertical levels of the uppermost and lowermost ends of the plurality of first through electrodes 130 or the plurality of second through electrodes 230 as illustrated in FIG. 1A.

In the Peltier structure PS, a first through structure TVP, the second connection wire PLB, a second through structure TVN, and the first connection wire PLF, which are sequentially connected, may be repeatedly connected to each other in series. In some embodiments, the first connection wire PLF may be connected to each of the first through structure TVP and the second through structure TVN arranged at both ends of the Peltier structure PS. In some embodiments, although not shown separately, the second connection wire PLB may be connected to each of the first through structure TVP and the second through structure TVN arranged at both ends of the Peltier structure PS.

Each of the first through structure TVP and the second through structure TVN may include, for example, Si, Poly-Si, SiGe, $Bi_2Te_3$, GeBiTe, and/or PbTe. In some embodiments, the first through structure TVP may further include a first conductivity type impurity, and the second through structure TVN may further include a second conductivity type impurity that is different from the first conductivity type impurity. For example, the first conductivity-type impurity may be a p-type impurity, and the second conductivity-type impurity may be an n-type impurity. For example, the p-type impurity may include one or more of boron (B), Al, gallium (Ga), In, thallium (Tl), Zn, cadmium (Cd), and mercury (Hg). For example, the n-type impurity may include one or more of nitrogen (N), phosphorus (P), arsenic (As), antimony (Sb), bismuth (Bi), sulfur (S), selenium (Se), tellurium (Te), and polonium (Po).

When a direct current is applied to the first through structure TVP and the second through structure TVN by the first voltage and the second voltage, electrons move in a direction opposite to the direction of current flow, while holes move in the same direction as the direction of current flow. In the first through structure TVP, main carriers are holes, and the holes move in the same direction as the direction of current. On the other hand, in the second through structure TVN, the main carriers are electrons, and the electrons move in a direction opposite to the direction of current. As a result, movement directions of the electrons and the holes are the same as each other, and due to the applied direct current, the electrons and the holes become media for transferring heat, so that a Peltier effect, which is the transfer of heat according to the current flow, may occur. That is, in the process of absorbing energy in order for free electrons moving by electromotive force to move to a higher Fermi energy level, heat is continuously absorbed from the side that gives electrons by absorbing and moving the most easily obtained thermal energy, and heat is continuously released from the other side. Therefore, in the stacked semiconductor chip structure 1000, by Peltier structures PS included in the first semiconductor chip 100 and the plurality of second semiconductor chips 200, heat may be transferred from bottom to top, that is, from the first semiconductor chip 100 to the uppermost second semiconductor chip 200 by the Peltier structures PS, and may be discharged to the outside through the uppermost second semiconductor chip 200.

Referring to FIG. 1B, the stacked semiconductor chip structure 1000 may include a first chip C1, a second chip C2, a third chip C3, a fourth chip C4, and a fifth chip C5 that are sequentially stacked. Each of the first chip C1, the second chip C2, the third chip C3, and the fourth chip C4 may include the Peltier structure PS. The Peltier structure PS included in each of the first chip C1, the second chip C2, the third chip C3, and the fourth chip C4 may be referred to as a first Peltier structure PS1, a second Peltier structure PS2, a third Peltier structure PS3, and a fourth Peltier structure PS4. The fifth chip C5 located farthest from the first chip C1 may not include a Peltier structure PS.

The first chip C1 may be the first semiconductor chip 100 shown in FIG. 1A, and the second chip C2, the third chip C3, the fourth chip C4, and the fifth chip C5 may be the plurality of second semiconductor chips 200 sequentially stacked on the first semiconductor chip 100 shown in FIG. 1A.

Each of the first Peltier structure PS1, the second Peltier structure PS2, the third Peltier structure PS3, and the fourth Peltier structure PS4 may be formed by alternately connecting the plurality of first through structures TVP to the plurality of second through structures TVN in series. The plurality of first through structures TVP and the plurality of second through structures TVN extending in the vertical direction (Z direction) may be alternately connected to each other in series by a first connection wire PLF and the second connection wire PLB extending on the horizontal plane (X-Y plane) to form the Peltier structure PS. The first through structure TVP and the second through structure TVN, which are connected to each other, may be connected from the lower side by the first connection wire PLF, or from the upper side by the second connection wire PLB.

A first voltage VT1 and a second voltage VT2 may be provided at both ends of each of the first Peltier structure PS1, the second Peltier structure PS2, the third Peltier structure PS3, and the fourth Peltier structure PS4, and the Peltier structures PS included in respective chips from among the first chip C1 to the fifth chip C5, that is, the first Peltier structure PS1, the second Peltier structure PS2, the third Peltier structure PS3, and the fourth Peltier structure PS4, may be connected to each other in parallel. In some embodiments, the first voltage VT1 may be a negative voltage, and the second voltage VT2 may be a positive voltage. In some embodiments, the first voltage VT1 may be ground, and the second voltage VT2 may be a power voltage.

Each of the first voltage VT1 and the second voltage VT2 may be provided at both ends of the first Peltier structure PS1, the second Peltier structure PS2, the third Peltier structure PS3, and the fourth Peltier structure PS4 from the first electrode 130 included in the first chip C1 and the second through electrode 230 included in each of the second chip C2, the third chip C3, and the fourth chip C4 that are corresponding to each other, through the first connection wire PLF.

Referring to FIGS. 1A and 1B together, the plurality of second dummy connection bumps 280D may be between each of the first Peltier structure PS1, the second Peltier structure PS2, the third Peltier structure PS3, and the fourth Peltier structure PS4.

In each of the first Peltier structure PS1, the second Peltier structure PS2, the third Peltier structure PS3, and the fourth Peltier structures PS4, the plurality of first through structures TVP and the plurality of second through structures TVN are alternately connected to each other in series, and the first Peltier structure PS1, the second Peltier structure PS2, the third Peltier structure PS3, and the fourth Peltier structure PS4 may be connected to each other in parallel. Accordingly, the stacked semiconductor chip structure 1000 according to some embodiments of the inventive concept may efficiently dissipate heat from the stacked semiconductor chip structure 1000 to the outside by the first Peltier structure PS1, the second Peltier structure PS2, the third Peltier structure PS3, and the fourth Peltier structure PS4 and the plurality of second dummy connection bumps 280D arranged between each of them.

Figure 2A:
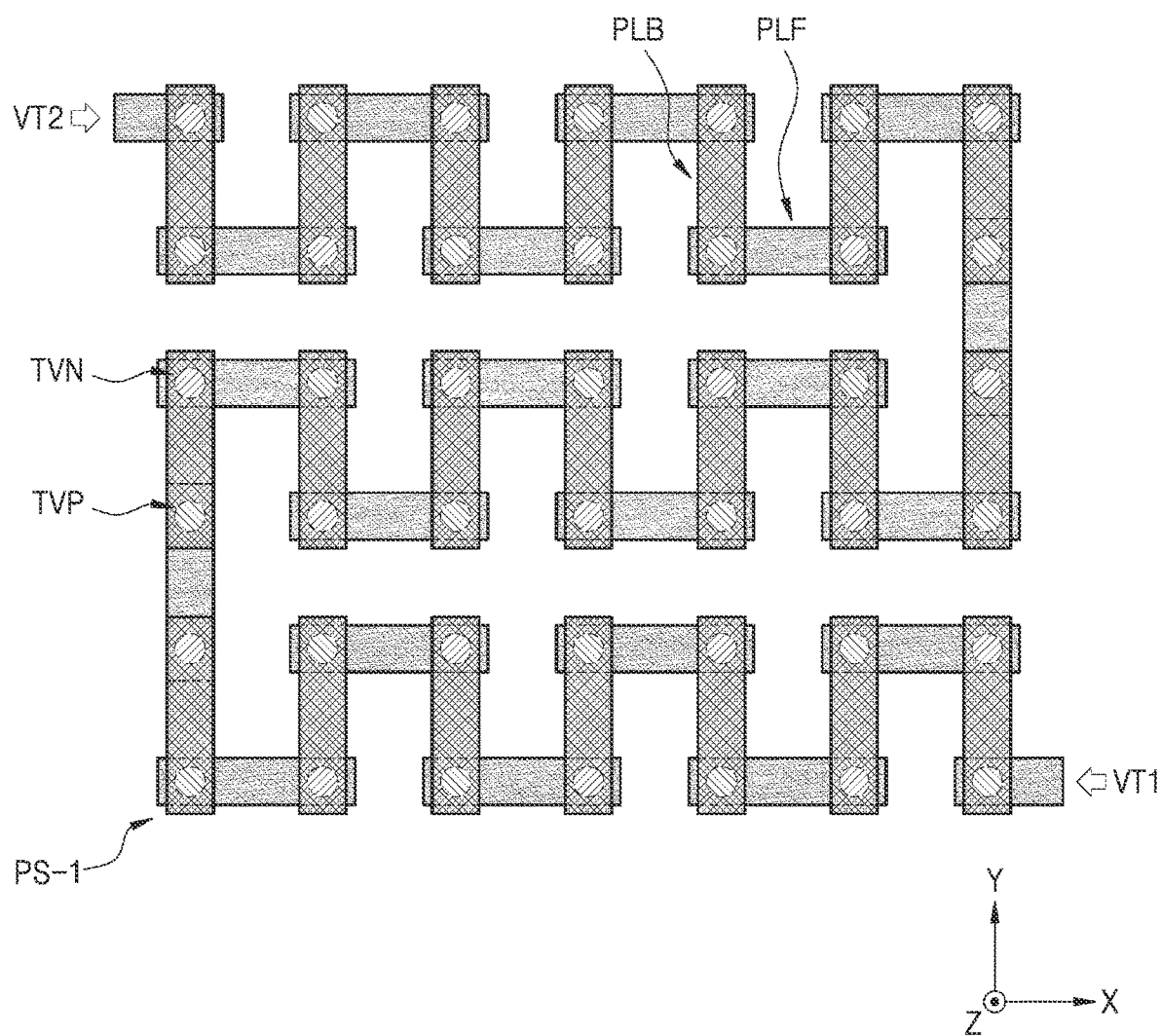
FIGS. 2A to 2C are layouts of a Peltier structure of a semiconductor chip according to some embodiments of the inventive concept.
Figure 2B:
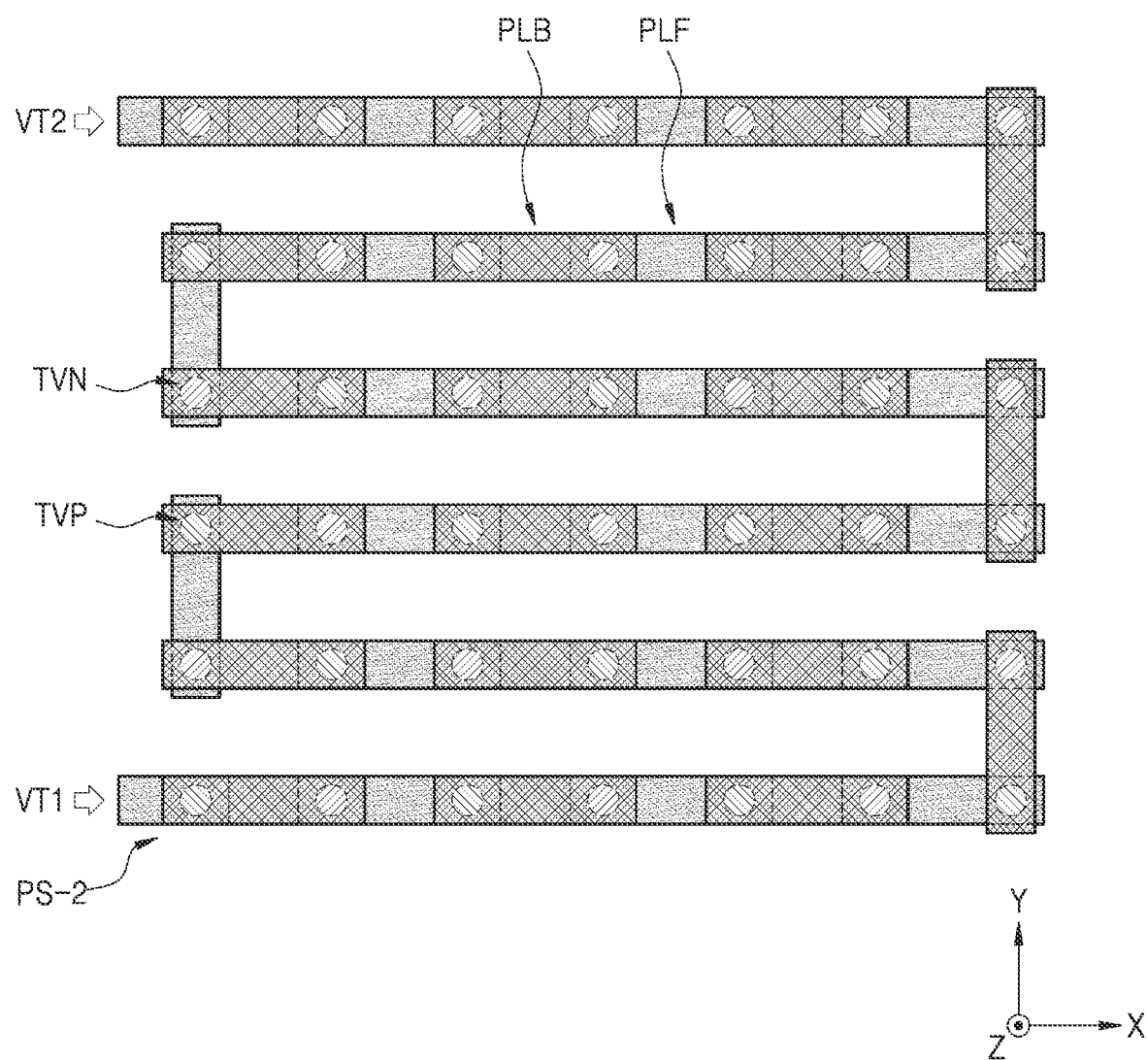
Figure 2C:
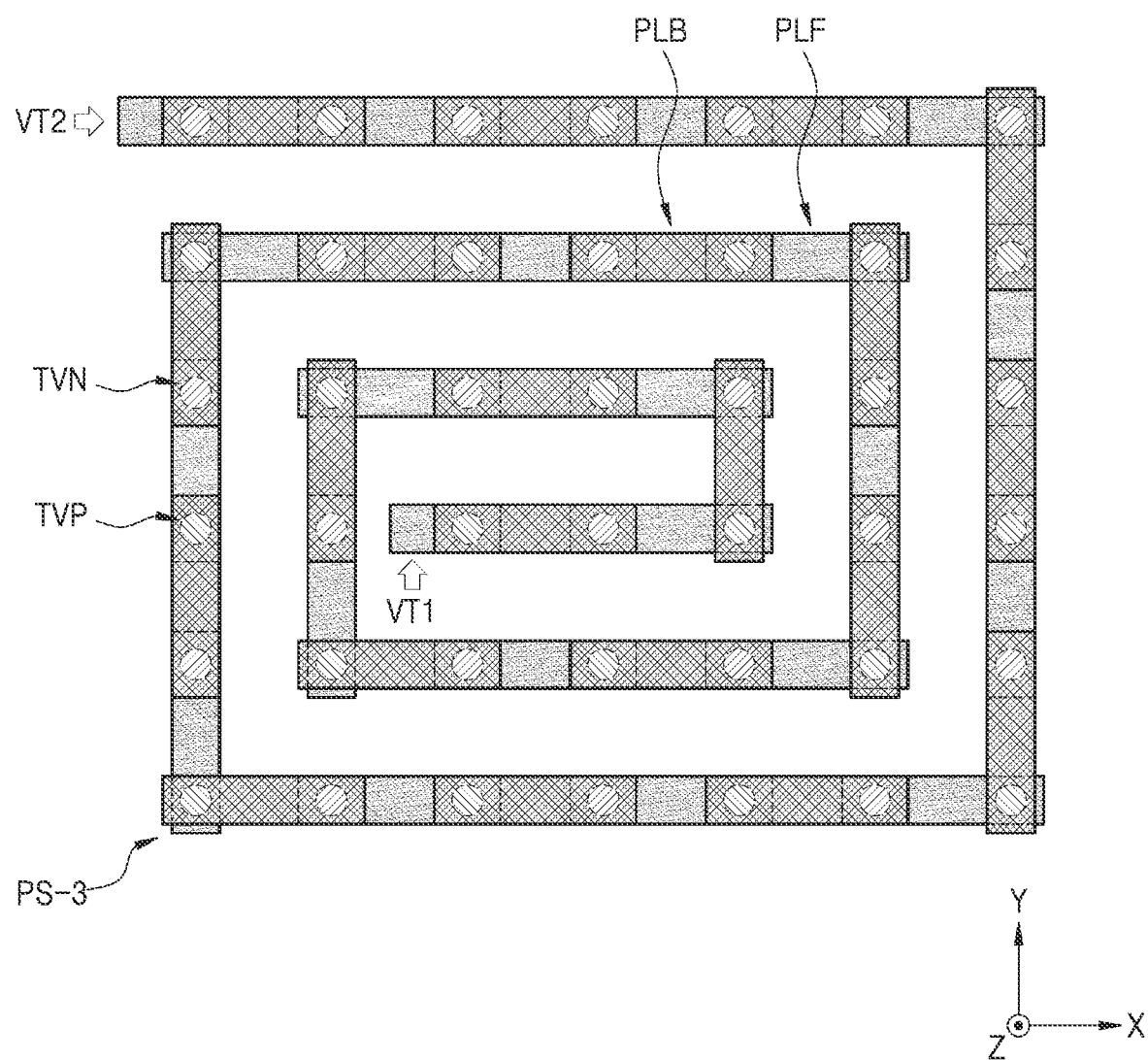

FIGS. 2A to 2C are layouts of a Peltier structure of a semiconductor chip according to some embodiments of the inventive concept.

Referring to FIG. 2A, a Peltier structure PS-1 is alternately arranged in each of the first horizontal direction (X direction) and the second horizontal direction (Y direction) perpendicular to the first horizontal direction (X direction), and includes the plurality of first through structures TVP and the plurality of second through structures TVN constituting a matrix arrangement. The first through structures TVP and the second through structures TVP arranged in the first horizontal direction (X direction) may form a row. The Peltier structure PS-1 may include the plurality of first connection wires PLF and the plurality of second connection wires PLB connecting the first through structures TVP and the second through structures TVP arranged in two adjacent columns in the second horizontal direction (Y direction) to each other in series.

In the Peltier structure PS-1, the plurality of first connection wires PLF and the plurality of second connection wires PLB connecting the plurality of first through structures TVP and the plurality of second through structures TVN to each other in series may be arranged to have a shape in which a flat U-shape and an upside down U-shape are alternately repeated in the first horizontal direction (X direction).

Referring to FIG. 2B, a Peltier structure PS-2 is alternately arranged in each of the first horizontal direction (X direction) and the second horizontal direction (Y direction), and includes the plurality of first through structures TVP and the plurality of second through structures TVN constituting a matrix arrangement. The first through structures TVP and the second through structures TVP arranged in the first horizontal direction (X direction) may form a row. In the Peltier structure PS-2, the first through structures TVP to the second through structures TVP arranged in each row may be connected in series, and the Peltier structure PS-2 may include the plurality of first connection wires PLF and the plurality of second connection wires PLB for connecting other columns adjacent in the second horizontal direction (Y direction) in series.

Referring to FIG. 2C, a Peltier structure PS-3 is alternately arranged in each of the first horizontal direction (X direction) and the second horizontal direction (Y direction), and includes the plurality of first through structures TVP and the plurality of second through structures TVN constituting a matrix arrangement. The Peltier structure PS-3 may include the plurality of first connection wires PLF and the plurality of second connection wires PLB connecting the plurality of first through structures TVP and the plurality of second through structures TVN forming a matrix arrangement in series in a spiral manner.

A method of connecting the plurality of first through structures TVP and the plurality of second through structures TVN included in the Peltier structures PS-1, PS-2, and PS-3 shown in FIGS. 2A to 2C in series is an example of the plurality of first through structures TVP and the plurality of second through structures TVN forming a matrix arrangement, but the inventive concept is not limited thereto. The method of connecting the plurality of first through structures TVP to the plurality of second through structures TVN in series may vary considering an arrangement formed by the plurality of first through structures TVP and the plurality of second through structures TVN, an arrangement of other components around the plurality of first through structures TVP and the plurality of second through structures TVN, and the like.

Figure 3A:
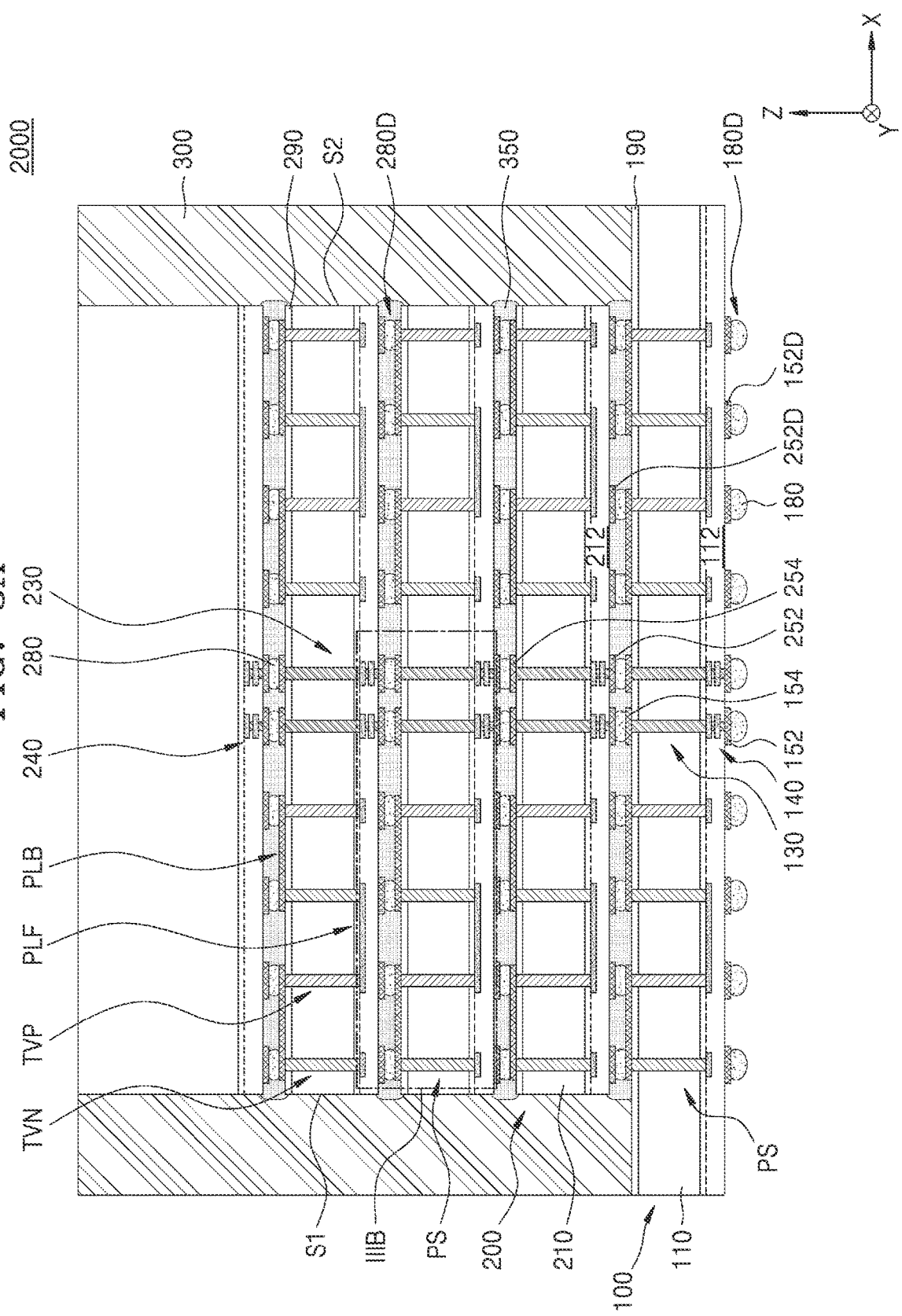
FIGS. 3A and 3B are cross-sectional and partially enlarged cross-sectional views illustrating a stacked semiconductor chip structure in which semiconductor chips are stacked according to some embodiments of the inventive concept.
Figure 3B:
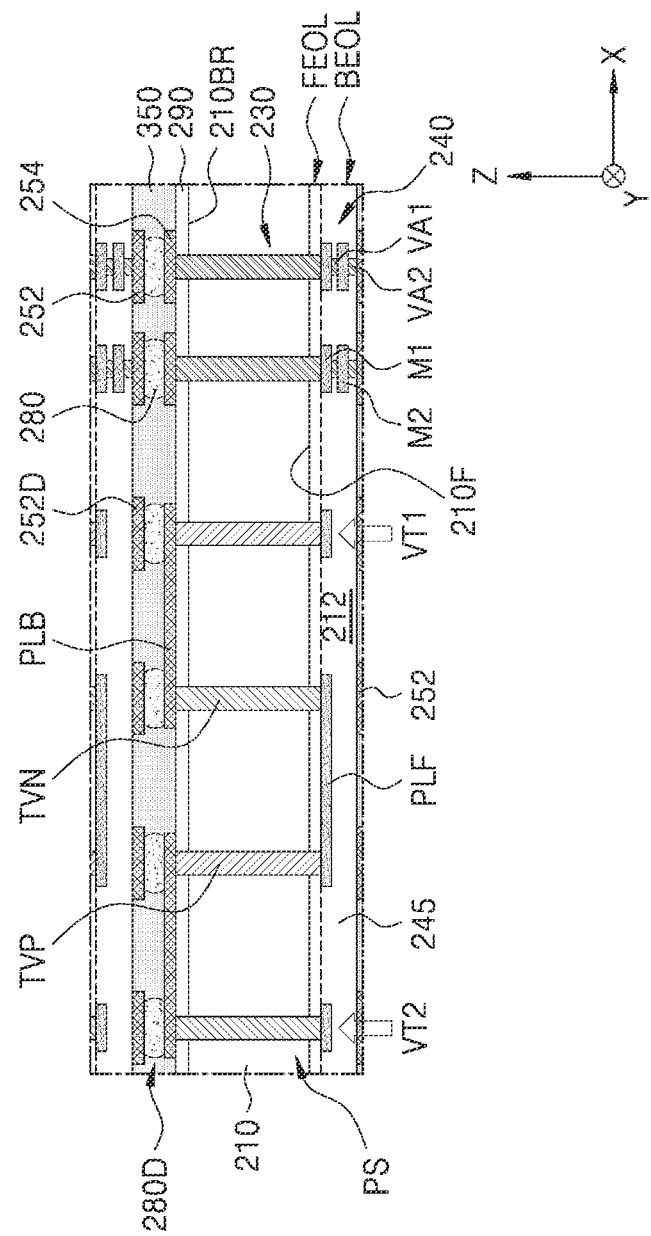

FIGS. 3A and 3B are cross-sectional and partially enlarged cross-sectional views illustrating a stacked semiconductor chip structure in which semiconductor chips are stacked according to some embodiments of the inventive concept. In FIGS. 3A and 3B, the same reference numerals as those of FIG. 1A refer to the same elements, and detailed descriptions thereof may not be given herein.

Referring to FIGS. 3A and 3B together, a stacked semiconductor chip structure 2000 may include the first semiconductor chip 100 and the plurality of second semiconductor chips 200.

The first semiconductor chip 100 may include a first semiconductor substrate 110 on which a first semiconductor device 112 is formed on an active surface of the first semiconductor substrate 110, a first wiring structure 140 formed on the active surface of the first semiconductor substrate 110, and a plurality of first through electrodes 130 connected to the first wiring structure 140 and penetrating at least a portion of the first semiconductor chip 100. In the stacked semiconductor chip structure 2000, the first semiconductor chip 100 may be arranged such that the active surface of the first semiconductor substrate 110 faces downward and an inactive surface thereof faces upward.

The second semiconductor chip 200 may include the second semiconductor substrate 210 on which the second semiconductor device 212 is formed on an active surface 210F of the second semiconductor substrate 210, and the second wiring structure 240 formed on the active surface 210F of the second semiconductor substrate 210. The second semiconductor chip 200 may further include the plurality of second through electrodes 230 connected to the second wiring structure 240 and penetrating at least a portion of the second semiconductor chip 200. In some embodiments, among the plurality of second semiconductor chips 200, the second semiconductor chip 200 located farthest from the first semiconductor chip 100 may not include the second through electrode 230. In the stacked semiconductor chip structure 2000, the plurality of second semiconductor chips 200 may be sequentially stacked on the first semiconductor chip 100 in the vertical direction (Z direction) each with the active surface 210F facing downward. The second semiconductor chip 200 may include the plurality of second through electrodes 230 and may have a first side surface S1 and a second side surface S2 opposite to each other.

In the second semiconductor chip 200, a front end of line (FEOL) layer FEOL and a back end of line (BEOL) layer BEOL may be sequentially stacked on the active surface 210F of the second semiconductor substrate 210. The second wiring structure 240 may be on the BEOL layer BEOL. The BEOL layer BEOL may include an inter-wire insulating layer 245 surrounding the second wiring structure 240. The inter-wiring insulating layer 245 may include, for example, silicon oxide, silicon nitride, epoxy, and/or polyimide. The second wiring structure 240 may be connected to a plurality of wiring patterns M1 and M2 extending on the horizontal plane (X-Y plane) and a plurality of wiring vias VA1 and VA2 connected to the plurality of wiring patterns M1 and M2 and extending in the vertical direction (Z direction). FIGS. 3A and 3B show that the second wiring structure 240 has a two-layer wiring structure, but this is provided as an example, and the inventive concept is not limited thereto. For example, the second wiring structure 240 may have a wiring structure of three or more layers. The plurality of wiring patterns M1 and M2 may include the first wiring pattern M1 at a vertical level closest to the second semiconductor substrate 210 and the second wiring pattern M2 at a vertical level farther from the second semiconductor substrate 210 than the first wiring pattern M1. The plurality of wiring vias VA1 and VA2 may include the first wiring via VA1 connecting the first wiring pattern M1 and the second wiring pattern M2, and the second wiring via VA2 connecting the second wiring pattern M2 and the second front pad 252.

The Peltier structure PS may be arranged between the plurality of second through electrodes 230 and the first side surface S1, and between the plurality of second through electrodes 230 and the second side surface S2.

The second through electrode 230 may extend in the vertical direction (Z direction) from an upper surface of the first wiring pattern M1 to a lower surface of the second rear pad 254. Each of the first through structure TVP and the second through structure TVN may extend in the vertical direction (Z direction) from an upper surface of the first connection wire PLF to a lower surface of the second connection wire PLB.

The first connection wire PLF may be formed together with the first wiring pattern M1, may include the same material as the first wiring pattern M1, may have the same thickness as the first wiring pattern M1, and may be at the same vertical level as the first wiring pattern M1. The upper surface of the first connection wire PLF may be at the same vertical level as the upper surface of the first wiring pattern M1. The second connection wire PLB may be formed together with the second rear pad 254, and the lower surface of the second connection wire PLB may be at the same vertical level as the lower surface of the second rear pad 254. In some embodiments, the first connection wire PLF and the first wiring pattern M1 may be spaced apart from the active surface 210F of the second semiconductor substrate 210 by an equal distance, and the second connection wire PLB and the second rear pad 254 may be spaced apart from the inactive surface 210BR of the second semiconductor substrate 210 by an equal distance as illustrated in FIG. 3B.

In the second semiconductor chip 200, each of the first through structure TVP, the second through structure TVN, and the second through electrode 230 may have an uppermost end at the same vertical level and may have a lowermost end at the same vertical level, and may have the same vertical height.

FIG. 3B shows only the second wiring structure 240 and the Peltier structure PS of the second semiconductor chip 200. In some embodiments, the first wiring structure 140 and the Peltier structure PS of the first semiconductor chip 100 may also have substantially the same structure as the second wiring structure 240 and the Peltier structure PS of the second semiconductor chip 200, and thus detailed descriptions thereof may not be given herein.

In the first semiconductor chip 100, the first connection wire PLF may be formed together with a wiring pattern at a vertical level closest the first semiconductor substrate 110, and the upper surface of the first connection wire PLF and an upper surface of the wiring pattern may be at the same vertical level. The second connection wire PLB may be formed together with the first rear pad 154, and the lower surface of the second connection wire PLB may be at the same vertical level as a lower surface of the first rear pad 154. In the second semiconductor chip 100, each of the first through structure TVP, the second through structure TVN, and the second through electrode 130 may have an uppermost end at the same vertical level and may have a lowermost end at the same vertical level, and may have the same vertical height.

Figure 4:
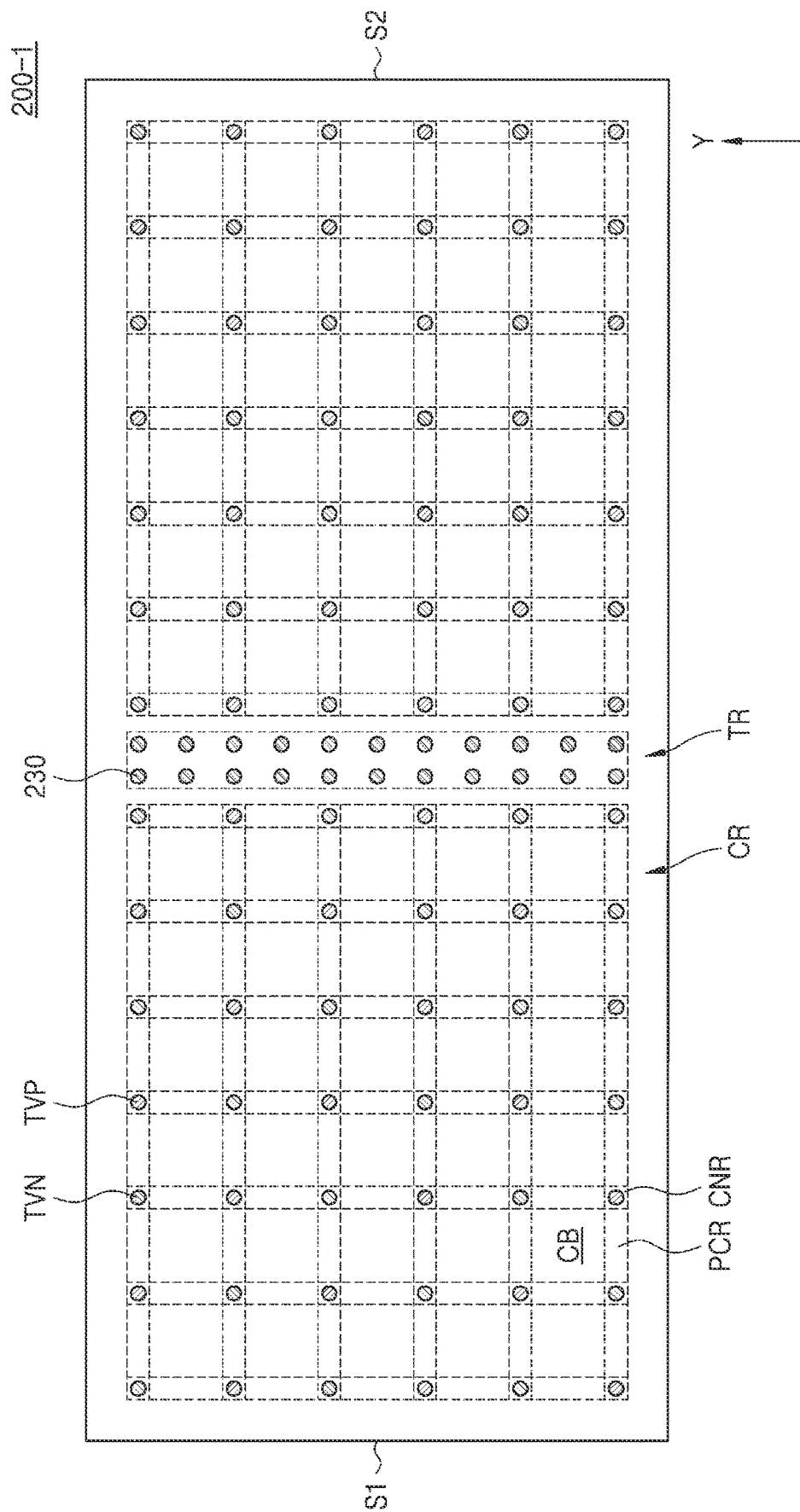
FIG. 4 is a layout of through electrodes and through structures of a semiconductor chip according to some embodiments of the inventive concept.

FIG. 4 is a layout of through electrodes and through structures of a semiconductor chip according to some embodiments of the inventive concept.

Referring to FIG. 4, a semiconductor chip 200-1 may have a cell area CR and a through electrode area TR. For example, the semiconductor chip 200-1 may be the second semiconductor chip 200 shown in FIGS. 1A, 3A, and 3B.

The plurality of second through electrodes 230 may be in the through electrode area TR. In some embodiments, the plurality of second through electrodes 230 may be arranged in a matrix arrangement with a constant pitch of several tens of μm in each of the first horizontal direction (X direction) and the second horizontal direction (Y direction).

The cell area CR may include a plurality of cell blocks CB and a peripheral circuit area PCR between the plurality of cell blocks CB. A plurality of corner areas CNR may be arranged in portions of the cell area CR adjacent to corners of the plurality of cell blocks CB. In portions other than the edge of the cell area CR, the corner areas CNR may be between the corners of four cell blocks CB. The plurality of first through structures TVP and the plurality of second through structures TVN may be arranged in the plurality of corner areas CNR, respectively. The plurality of first through structures TVP and the plurality of second through structures TVN may be arranged with a pitch greater than a pitch at which the plurality of second through electrodes 230 are arranged. In some embodiments, the plurality of first through structures TVP and the plurality of second through structures TVN may be arranged with a pitch of several hundred μm in each of the first horizontal direction (X direction) and the second horizontal direction (Y direction).

In some embodiments, the semiconductor chip 200-1 may have the plurality of cell areas CR, and the through electrode area TR may be between the plurality of cell areas CR. For example, the through electrode area TR may be in the middle of the semiconductor chip 200-1 in a plan view, and two cell areas CR may be on opposite sides of the through electrode area TR, respectively.

The semiconductor chip 200-1 may have the through electrode area TR therebetween and have the first side surface S1 and the second side surface S2 opposite to each other. The plurality of first through structures TVP and the plurality of second through structures TVN may be arranged in a cell area CR between the through electrode area TR and the second side surface S2 and a cell area CR between the through electrode area TR and the first side surface S1.

The plurality of first through structures TVP and the plurality of second through structures TVN may be substantially uniformly arranged over the plurality of cell areas CR except for the through electrode area TR in a plan view. In some embodiments, the plurality of first through structures TVP and the plurality of second through structures TVN may be spaced apart from each other by an equal distance as illustrated in FIG. 4.

In some embodiments, the plurality of first through structures TVP and the plurality of second through structures TVN constituting the Peltier structure PS of the first semiconductor chip 100 shown in FIG. 3A may be arranged substantially the same as the plurality of first through structures TVP and the plurality of second through structures TVN of the semiconductor chip 200-1 shown in FIG. 4.

Figure 5:
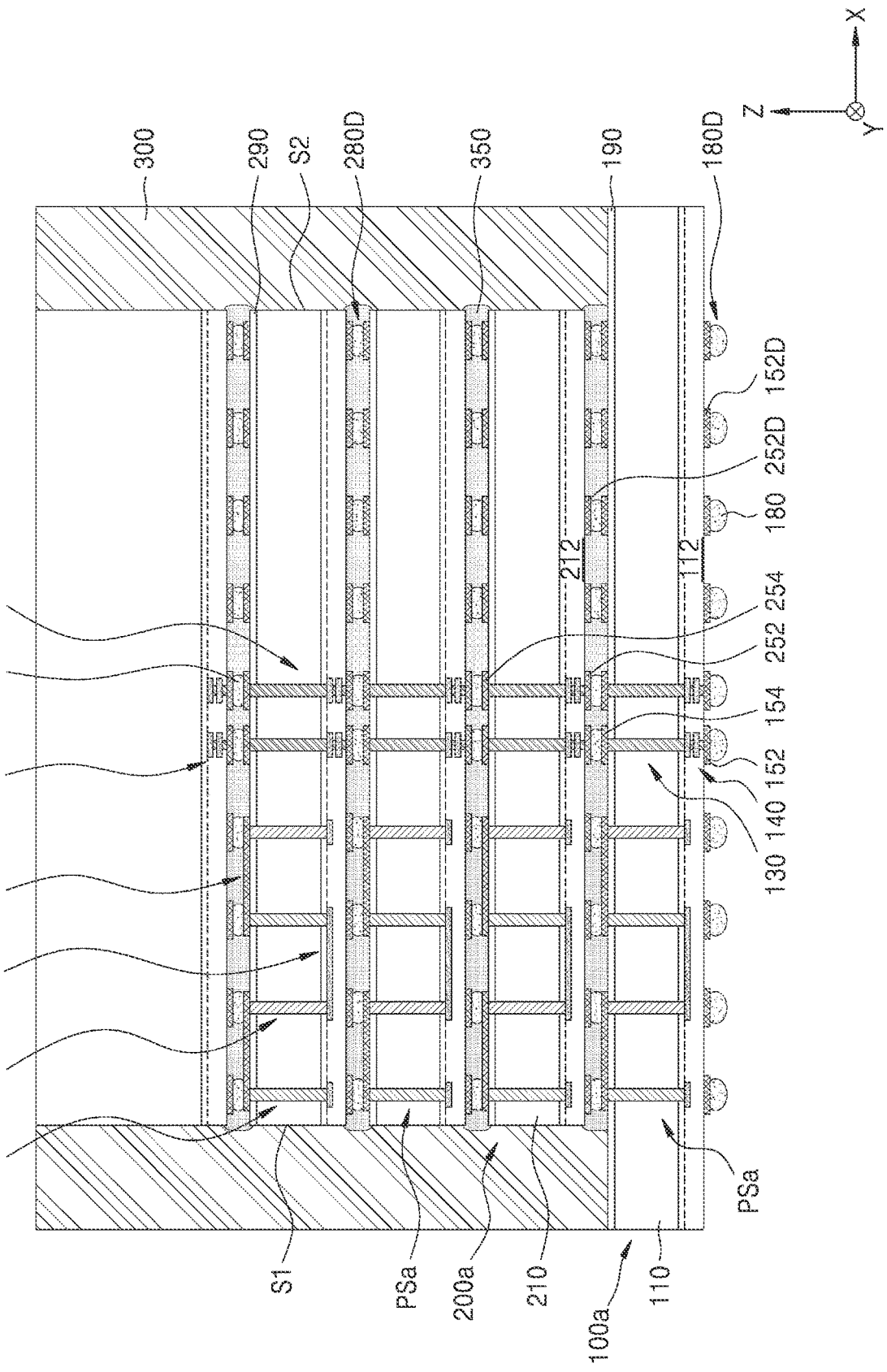
FIG. 5 is a cross-sectional view of a stacked semiconductor chip structure in which semiconductor chips are stacked according to some embodiments of the inventive concept.

FIG. 5 is a cross-sectional view of a stacked semiconductor chip structure in which semiconductor chips are stacked according to some embodiments of the inventive concept. In FIG. 5, the same reference numerals as those of FIG. 3A refer to the same elements, and detailed descriptions thereof may not be given herein.

Referring to FIG. 5, a stacked semiconductor chip structure 2000a may include a first semiconductor chip 100a and a plurality of second semiconductor chips 200a. Each of the first semiconductor chip 100a and a second semiconductor chip 200a may have a Peltier structure PSa. The plurality of first through structures TVP and the plurality of second through structures TVN may be alternately connected to each other in series by the first connection wire PLF and the second connection wire PLB to form the Peltier structure PSa.

The Peltier structure PSa may be arranged between the plurality of second through electrodes 230 and the first side surface S1, but may not be arranged between the plurality of second through electrodes 230 and the second side surface S2.

Figure 6:
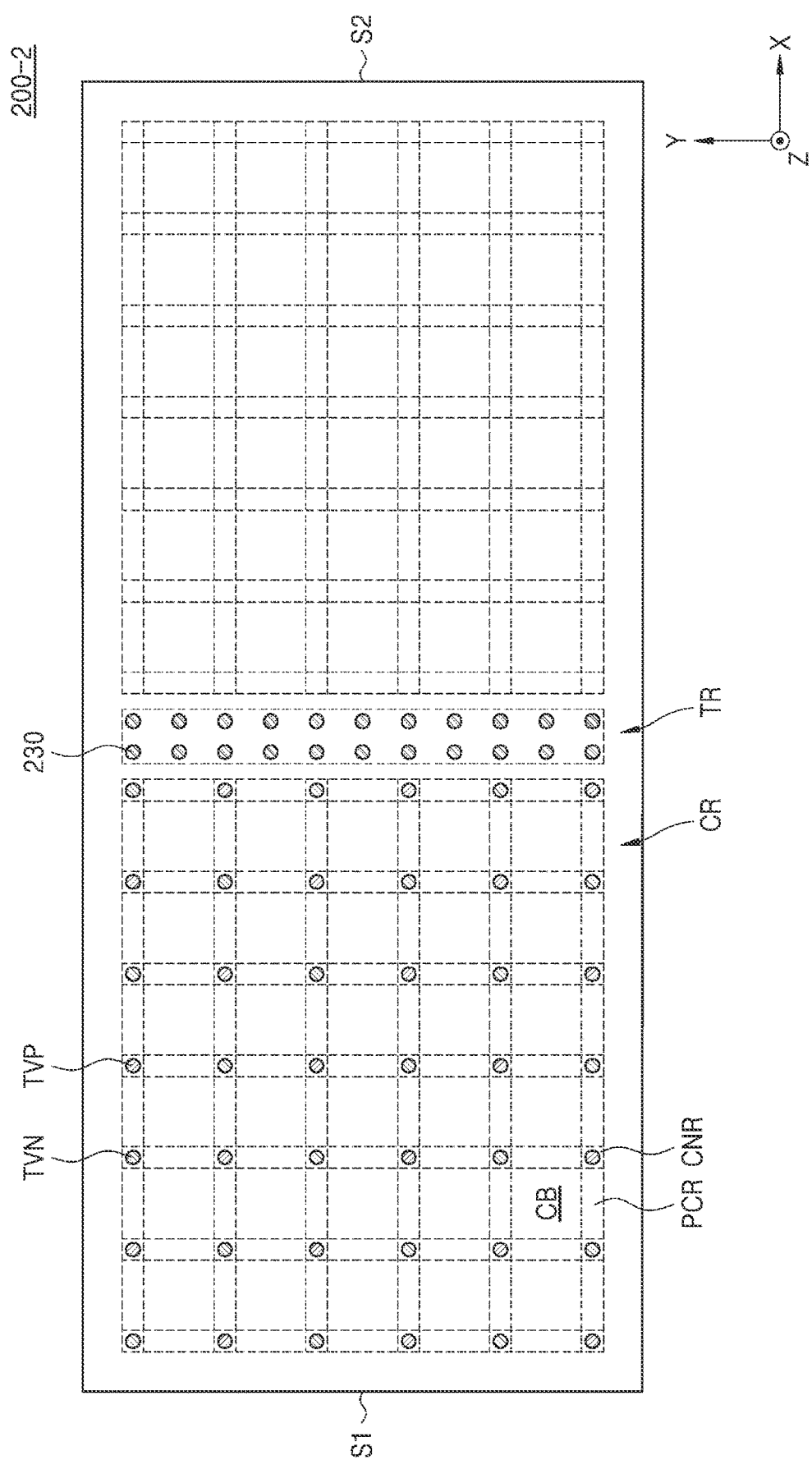
FIG. 6 is a layout of through electrodes and through structures of a semiconductor chip according to some embodiments of the inventive concept.

FIG. 6 is a layout of through electrodes and through structures of a semiconductor chip according to some embodiments of the inventive concept. In FIG. 6, the same reference numerals as those of FIG. 4 refer to the same elements, and detailed descriptions thereof may not be given herein.

Referring to FIG. 6, a semiconductor chip 200-2 may have the cell area CR and the through electrode area TR. For example, the semiconductor chip 200-2 may be the second semiconductor chip 200a shown in FIG. 5. The plurality of second through electrodes 230 may be in the through electrode area TR.

In some embodiments, the semiconductor chip 200-2 may have the plurality of cell areas CR, and the through electrode area TR may be between the plurality of cell areas CR. For example, the through electrode area TR may be in the middle of the semiconductor chip 200-2 in a plan view, and two cell areas CR may be on opposite sides of the through electrode area TR, respectively.

The cell area CR may include the plurality of cell blocks CB and the peripheral circuit area PCR between the plurality of cell blocks CB. The plurality of corner areas CNR may be arranged in portions of the cell area CR adjacent to corners of the plurality of cell blocks CB. In portions other than the edge of the cell area CR, the corner areas CNR may be between the corners of four cell areas CR. The plurality of first through structures TVP and the plurality of second through structures TVN may be arranged in the plurality of corner areas CNR, respectively.

The semiconductor chip 200-2 may have the through electrode area TR and may have the first side surface S1 and the second side surface S2 opposite to each other. The plurality of first through structures TVP and the plurality of second through structures TVN may be in the cell area CR between the through electrode area TR and the first side surface S1 but may not be in the cell area CR between the through electrode area TR and the second side surface S2.

In some embodiments, the plurality of first through structures TVP and the plurality of second through structures TVN constituting the Peltier structure PS of the first semiconductor chip 100a shown in FIG. 5 may be arranged substantially the same as the plurality of first through structures TVP and the plurality of second through structures TVN of the semiconductor chip 200-2 shown in FIG. 6.

Figure 7:
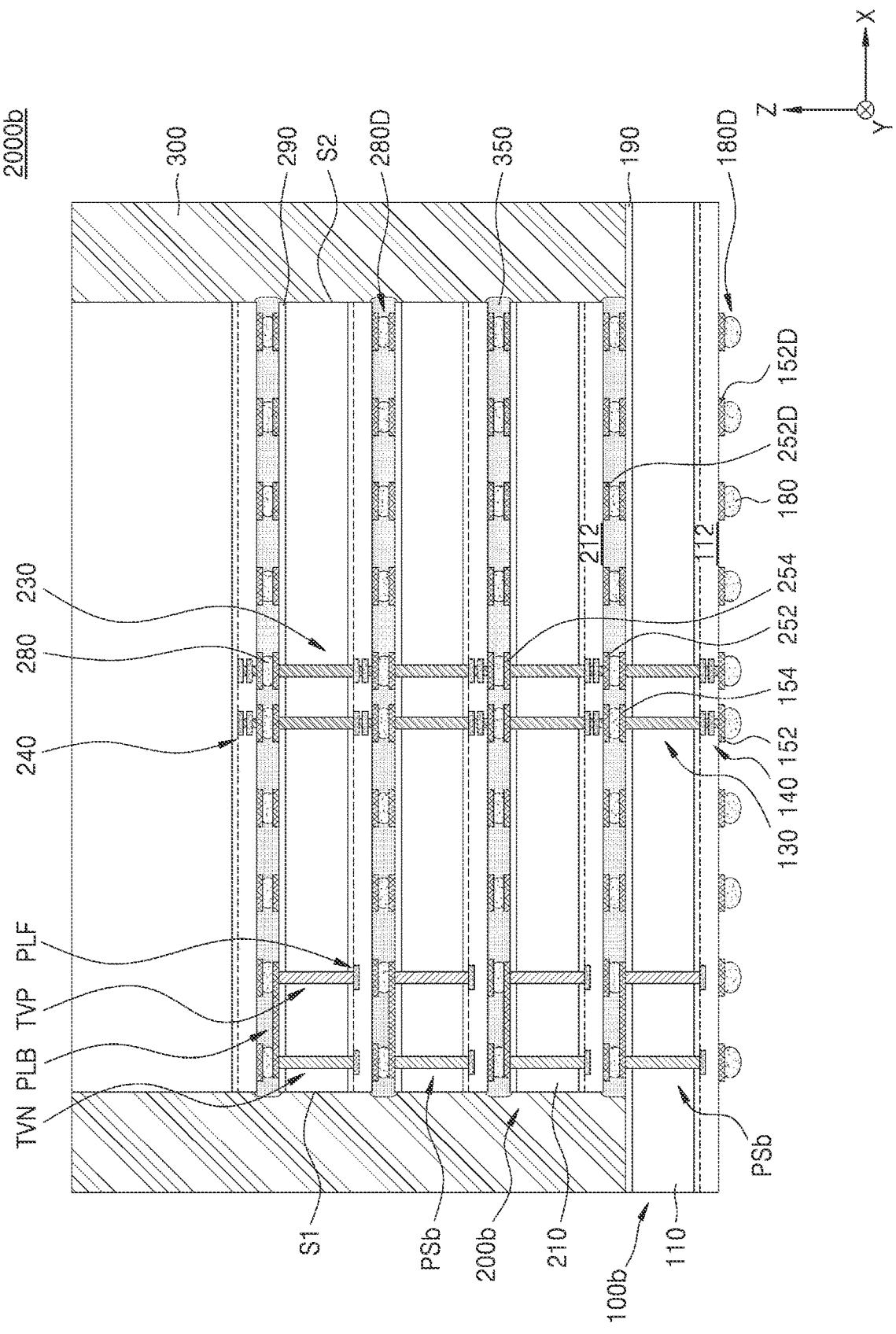
FIG. 7 is a cross-sectional view of a stacked semiconductor chip structure in which semiconductor chips are stacked according to some embodiments of the inventive concept.

FIG. 7 is a cross-sectional view of a stacked semiconductor chip structure in which semiconductor chips are stacked according to some embodiments of the inventive concept. In FIG. 7, the same reference numerals as those of FIGS. 3A and 5 refer to the same elements, and detailed descriptions thereof may not be given herein.

Referring to FIG. 7, a stacked semiconductor chip structure 2000b may include a first semiconductor chip 100b and a plurality of second semiconductor chips 200b. Each of the first semiconductor chip 100b and the second semiconductor chips 200b may have a Peltier structure PSb. The plurality of first through structures TVP and the plurality of second through structures TVN may be alternately connected to each other in series by the first connection wire PLF and the second connection wire PLB to form the Peltier structure PSb.

The Peltier structure PSb may be arranged only in a portion adjacent to the first side surface S1 but may not be arranged in the remaining portion. For example, the Peltier structure PSb may be arranged in a portion adjacent to the first side surface S1 between the plurality of second through electrodes 230 and the first side surface S1, and may not be arranged in a portion adjacent to the plurality of second through electrodes 230. For example, the Peltier structure PSb may not be arranged between the plurality of second through electrodes 230 and the second side surface S2.

Figure 8:
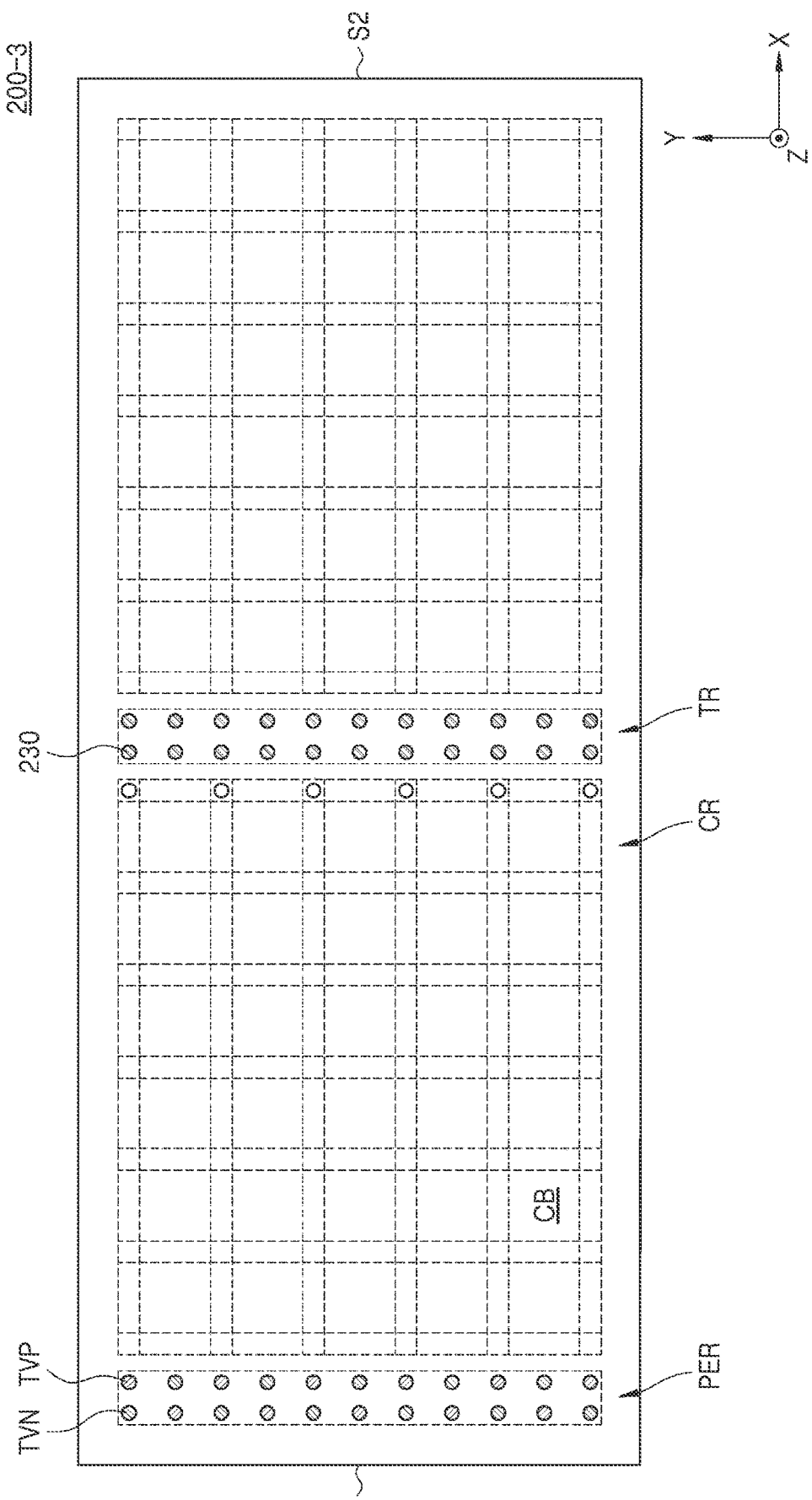
FIG. 8 is a layout of through electrodes and through structures of a semiconductor chip according to some embodiments of the inventive concept.

FIG. 8 is a layout of through electrodes and through structures of a semiconductor chip according to some embodiments of the inventive concept. In FIG. 8, the same reference numerals as those of FIGS. 4 and 6 refer to the same elements, and detailed descriptions thereof may not be given herein.

Referring to FIG. 8, a semiconductor chip 200-3 may have the cell area CR, the through electrode area TR, and a through structure area PER. For example, the semiconductor chip 200-3 may be a second semiconductor chip 200b shown in FIG. 7. The plurality of second through electrodes 230 may be in the through electrode area TR.

In some embodiments, the semiconductor chip 200-3 may have the plurality of cell areas CR, and the through electrode area TR may be between the plurality of cell areas CR. For example, the through electrode area TR may be in the middle of the semiconductor chip 200-3 in a plan view, and two cell areas CR may be on opposite sides of the through electrode area TR, respectively. The through structure area PER may be adjacent to the first side surface S1 and arranged between the first side surface S1 and the cell area CR.

Each of the plurality of first through structures TVP and the plurality of second through structures TVN may be in the through structure area PER. In some embodiments, the plurality of first through structures TVP and the plurality of second through structures TVN may be arranged with a pitch substantially equal to a pitch at which the plurality of second through electrodes 230 are arranged. In some embodiments, the plurality of first through structures TVP and the plurality of second through structures TVN may be arranged with a pitch of several tens of μm in each of the first horizontal direction (X direction) and the second horizontal direction (Y direction).

The semiconductor chip 200-3 may have the through electrode area TR therebetween and have the first side surface S1 and the second side surface S2 opposite to each other. The plurality of first through structures TVP and the plurality of second through structures TVN are arranged to be adjacent to the first side surface S1 in a plan view, and may not be arranged on the remaining portions.

In some embodiments, the plurality of first through structures TVP and the plurality of second through structures TVN constituting the Peltier structure PSb of the first semiconductor chip 100b shown in FIG. 7 may be arranged substantially the same as the plurality of first through structures TVP and the plurality of second through structures TVN of the semiconductor chip 200-3 shown in FIG. 8.

FIGS. 9A to 9I are cross-sectional views illustrating methods of manufacturing a semiconductor chip according to some embodiments of the inventive concept. FIGS. 9A to 9I are cross-sectional views illustrating methods of manufacturing the second semiconductor chip 200 shown in FIG. 3A, and, in some embodiments, the first semiconductor chip 100 may also be manufactured by methods described with reference to FIGS. 9A to 9I.

Referring to FIG. 9A, the second semiconductor substrate 210 may be attached to a first carrier substrate 10 to which a first release film 12 is attached. The second semiconductor substrate 210 may include an inactive surface 210B facing and attaching to the first release film 12, and may be arranged such that the inactive surface 210B faces downward and the active surface 210F faces upward.

The first carrier substrate 10 may include any material having stability against subsequent processes or the like. In some embodiments, the first carrier substrate 10 may be separated and removed by laser ablation during subsequent processes, and the first carrier substrate 10 may be, for example, a translucent substrate. In some embodiments, the first carrier substrate 10 may be separated and removed by heating during subsequent processes, and the first carrier substrate 10 may be, for example, a heat-resistant substrate. In some embodiments, the first carrier substrate 10 may be, for example, a semiconductor substrate, a ceramic substrate, or a glass substrate. In some other embodiments, the first carrier substrate 10 may include, for example, a heat-resistant organic polymer material such as polyimide (PI), polyetheretherketone (PEEK), polyethersulfone (PES), and/or polyphenylene sulfide (PPS), but the inventive concept is not limited thereto.

The first release film 12 may include, for example, a laser reaction layer or a thermal reaction layer capable of separating the first carrier substrate 10 by vaporization in response to subsequent laser irradiation or heating. In some embodiments, the first release film 12 may include a single layer, or may have a multilayer structure including a release layer attached to both surfaces of a backbone layer. The backbone layer may include, for example, a thermoplastic polymer. The release layer may include, for example, a copolymer of acrylic and/or silicone.

Figure 9B:
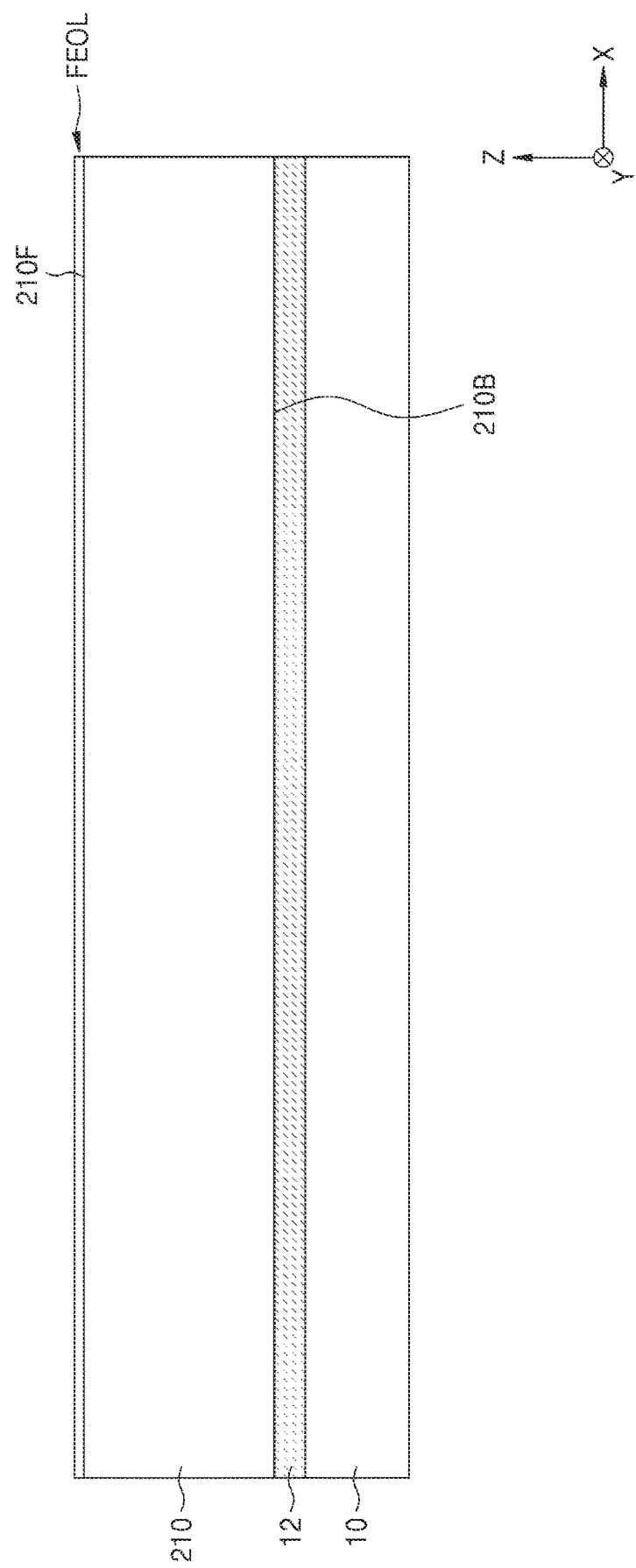

Referring to FIG. 9B, the FEOL layer FEOL may be formed on the active surface 210F of the second semiconductor substrate 210. Before forming the FEOL layer FEOL, a conductive area such as a well doped with impurities and/or various device isolation structures such as an STI structure may be formed in the second semiconductor substrate 210.

The FEOL layer FEOL may include a conductive material layer and an insulating material layer for forming a plurality of individual devices of various types. In some embodiments, the FEOL layer FEOL may include DRAM memory cells.

Referring to FIG. 9C, a plurality of vertical holes 230H extending from the active surface 210F of the second semiconductor substrate 210 toward the inactive surface 210B are formed. The plurality of vertical holes 230H may penetrate a portion of the second semiconductor substrate 210 so as not to extend to the inactive surface 210B of the second semiconductor substrate 210.

FIG. 9C shows that the plurality of vertical holes 230H penetrate the FEOL layer FEOL and may extend into the inside of the second semiconductor substrate 210 from the active surface 210F of the second semiconductor substrate 210, but the inventive concept is not limited thereto. In some embodiments, the plurality of vertical holes 230H may be formed to penetrate at least a portion of the second semiconductor substrate 210 before forming the FEOL layer FEOL. In some embodiments, the plurality of vertical holes 230H may be formed to penetrate the BEOL layer BEOL and the FEOL layer FEOL after forming a BEOL layer BEOL to be described later in FIG. 9D, and to penetrate at least a portion of the second semiconductor substrate 210.

The plurality of second through electrodes 230 may be formed in some of the plurality of vertical holes 230H, the plurality of first through structures TVP are formed in some of the plurality of vertical holes 230H, and the plurality of second through structures TVN are formed in some of the plurality of vertical holes 230H. The plurality of second through electrodes 230, the plurality of first through structures TVP, and the plurality of second through structures TVN may be formed by filling the plurality of vertical holes 230H to form the arrangement of the plurality of second through electrodes 230, the plurality of first through structures TVP, and the plurality of second through structures TVN shown in FIGS. 4 to 6.

Before forming the plurality of second through electrodes 230, in some embodiments, the plurality of first through structures TVP, and the plurality of second through structures TVN, a plurality of via insulating layers covering inner surfaces of the plurality of vertical holes 230H may be formed, so that the plurality of via insulating layers may surround sidewalls of the plurality of second through electrodes 230, the plurality of first through structures TVP, and the plurality of second through structures TVN.

Figure 9D:
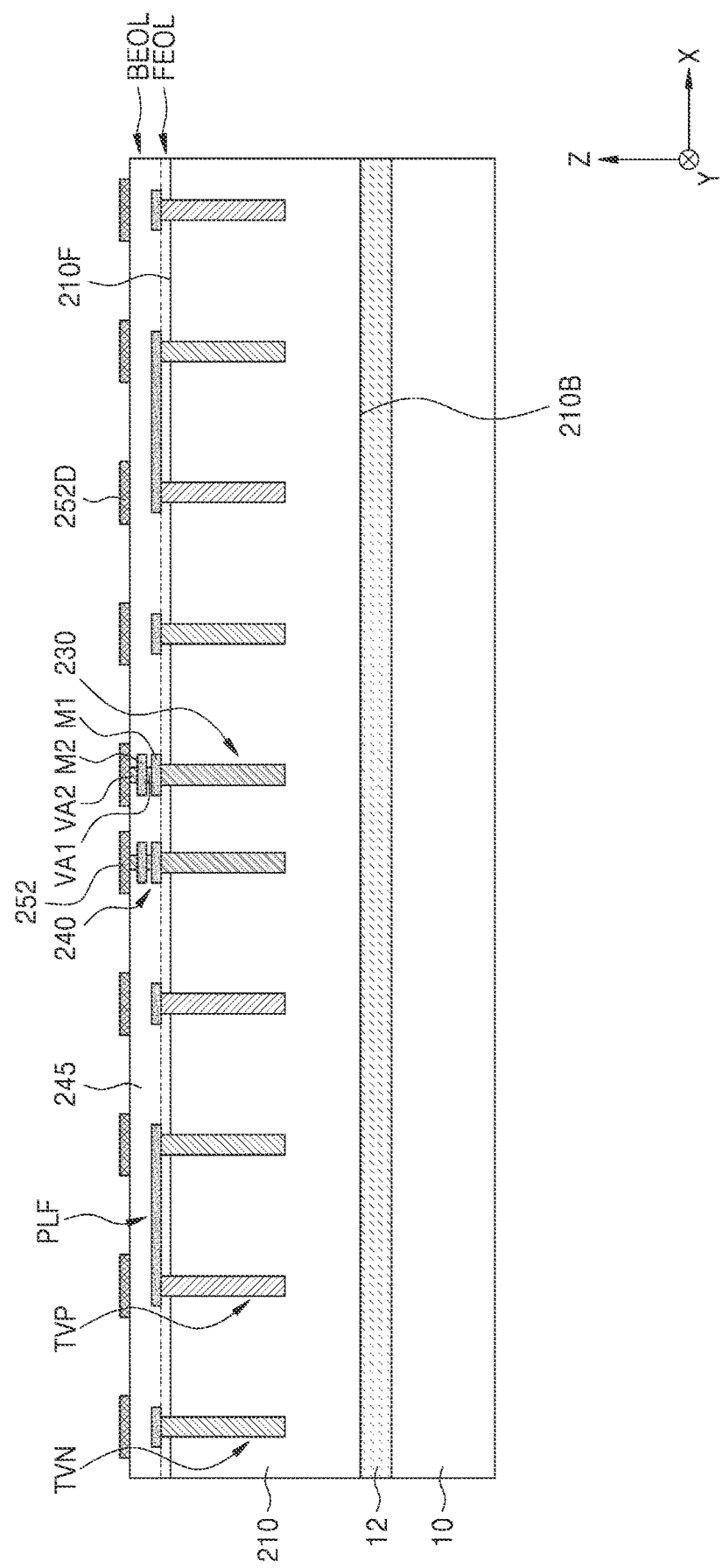

Referring to FIG. 9D, the BEOL layer BEOL including the second wiring structure 240 and the inter-wiring insulation layer 245 surrounding the second wiring structure 240 may be formed on the FEOL layer FEOL.

The second wiring structure 240 may include the plurality of first wiring patterns M1 and the plurality of second wiring patterns M2 extending on the horizontal plane (XY plane), and the plurality of first wiring via VA1 and the plurality of second wiring via VA2 connected to the plurality of first wiring patterns M1 and the plurality of second wiring patterns M2 and extending in the vertical direction (Z direction). The second wiring structure 240 may further include a plurality of first connection wires PLF formed together with the plurality of first wiring patterns M1.

In some embodiments, at least some of the plurality of wiring patterns M1 may be formed to be in contact with upper surfaces of the plurality of second through electrodes 230, and at least some of the plurality of first connection wires PLF may be formed to be in contact with upper surfaces of the plurality of first through structures TVP and the plurality of second through structures TVN.

The plurality of second front pads 252 may be formed on the BEOL layer BEOL. Some of the plurality of second front pads 252 may be formed to be connected to the second wiring structure 240 to be electrically connected to the plurality of second through electrodes 230, and some of the plurality of second front pads 252 may be on the inter-wire insulating layer 245 of the BEOL layer BEOL so as not to be connected to the second wiring structure 240. The second front pad 252 not connected to the second wiring structure 240 from among the plurality of second front pads 252 may be referred to as the second dummy front pad 252D. Among the plurality of second front pads 252, a second front pad 252 electrically connected to the second through electrode 230 may be referred to as a second signal front pad.

Referring to FIGS. 9D and 9E together, after being separated from the first carrier substrate 10 to which the first release film 12 is attached, the second semiconductor substrate 210 is attached to a second carrier substrate 20 to which a second release film 22 is attached by being turned upside down. In the second semiconductor substrate 210, the BEOL layer BEOL on which the plurality of second front pads 252 are formed may be attached to the second release film 22, and the second semiconductor substrate 210 may be arranged such that the inactive surface 210B faces upward and the active surface 210F faces downward.

Figure 9F:
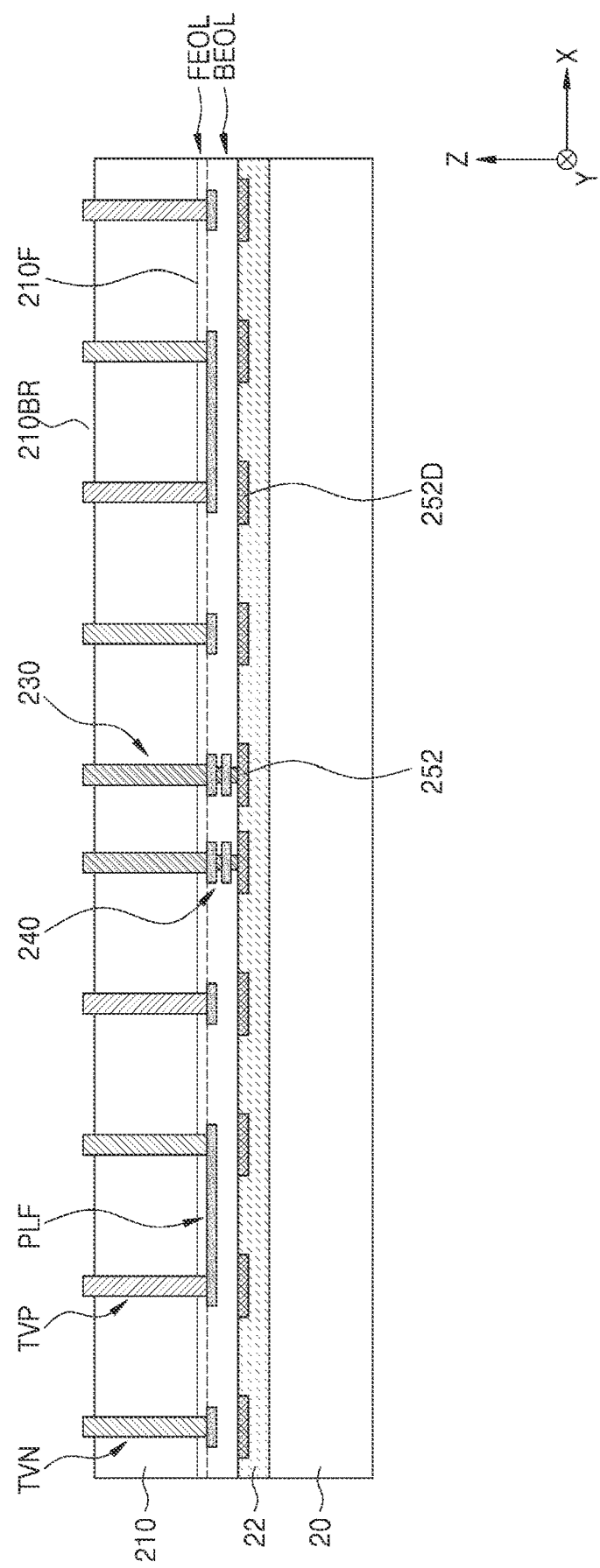

Referring to FIGS. 9E and 9F together, by removing a portion of the second semiconductor substrate 210 from the inactive surface 210B of the second semiconductor substrate 210, the plurality of second through electrodes 230, the plurality of first through structures TVP, and the plurality of the second through structure TVN may be exposed. Because a portion of the second semiconductor substrate 210 is removed, the second semiconductor substrate 210 may have an inactive surface 210BR shown in FIG. 9F instead of the inactive surface 210B shown in FIG. 9E. A portion of the second semiconductor substrate 210 may be removed so that a portion of the plurality of second through electrodes 230, the plurality of first through structures TVP, and the plurality of second through structures TVN may protrude from the inactive surface 210BR.

Figure 9G:
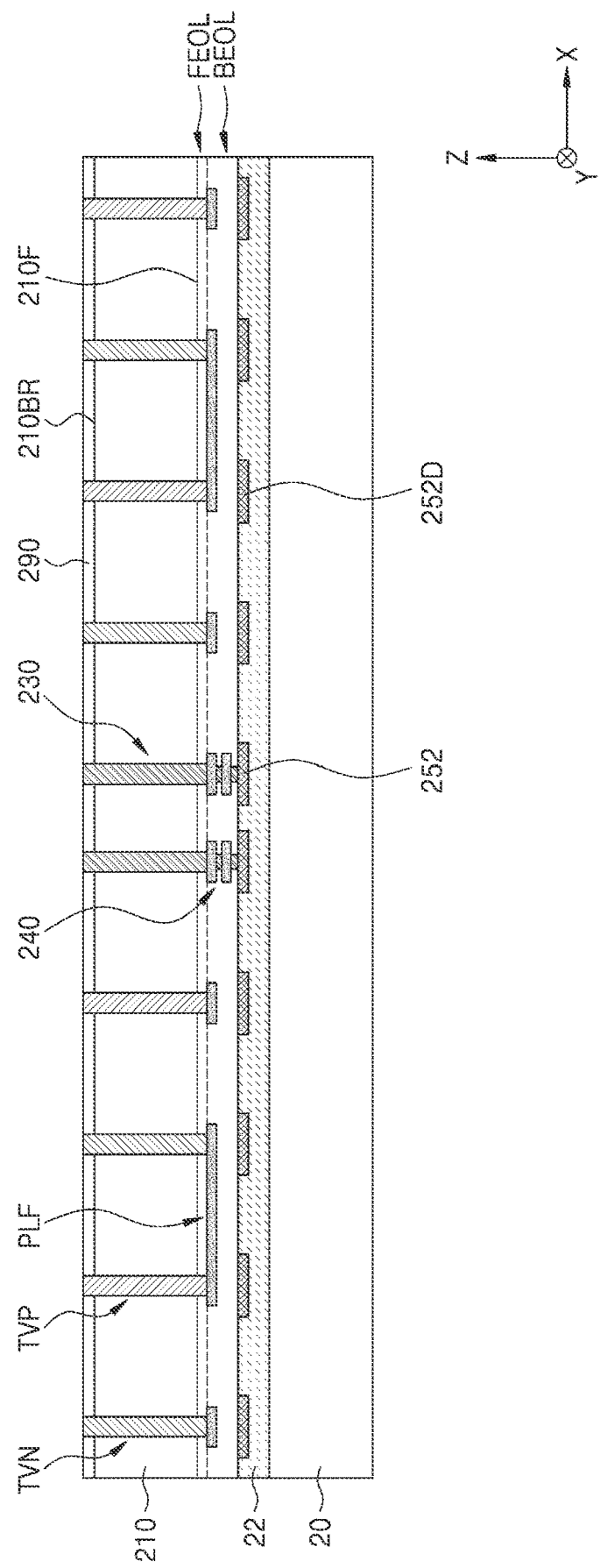

Referring to FIG. 9G, the second rear protective layer 290 may be formed to cover the inactive surface 210BR of the second semiconductor substrate 210. In the second rear protective layer 290, portions of the plurality of second through electrodes 230, the plurality of first through structures TVP, and the plurality of second through structures TVN protruding from the inactive surface 210BR of the second semiconductor substrate 210 may be surrounded by the second rear protective layer 290.

In some embodiments, upper surfaces of the plurality of second through electrodes 230, the plurality of first through structures TVP, and the plurality of second through structures TVN may be coplanar with an upper surface of the second rear protective layer 290.

Referring to FIG. 9H, a plurality of second rear pads 254 and the plurality of second connection wires PLB may be formed on the second rear protective layer 290. The plurality of second rear pads 254 may be formed to be in contact with the upper surfaces of the plurality of second through electrodes 230, and the plurality of second connection wires PLB may be formed to be in contact with upper surfaces of the plurality of first through structures TVP and the plurality of second through structures TVN respectively to connect between at least two of the plurality of first through structures TVP and the plurality of second through structures TVN.

Figure 9I:
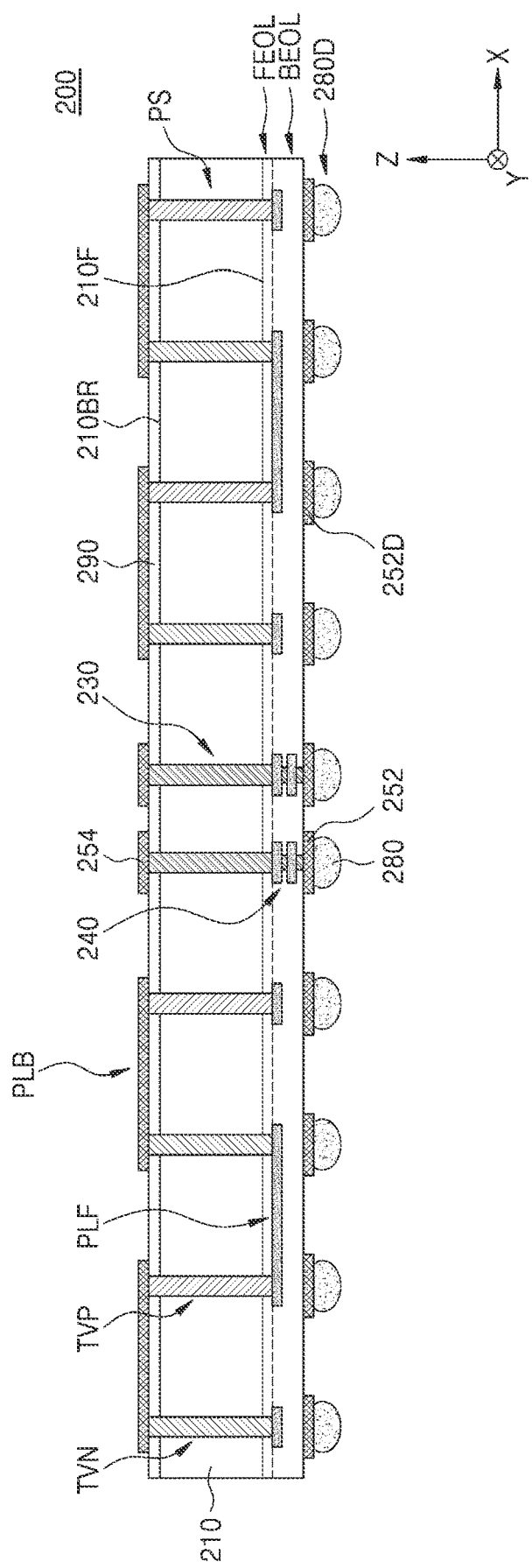

Referring to FIGS. 9H and 9I together, after separating the second semiconductor substrate 210 from the second carrier substrate 20 to which the second release film 22 is attached, the second semiconductor chip 200 may be formed by attaching the plurality of second connection bumps 280 on the plurality of second front pads 252.

Among the plurality of second connection bumps 280, a second connection bump 280 attached to the second dummy front pad 252D may be the second dummy connection bump 280D, and a second connection bump 280 attached to the second signal front pad may be a second signal connection bump.

Figure 10:
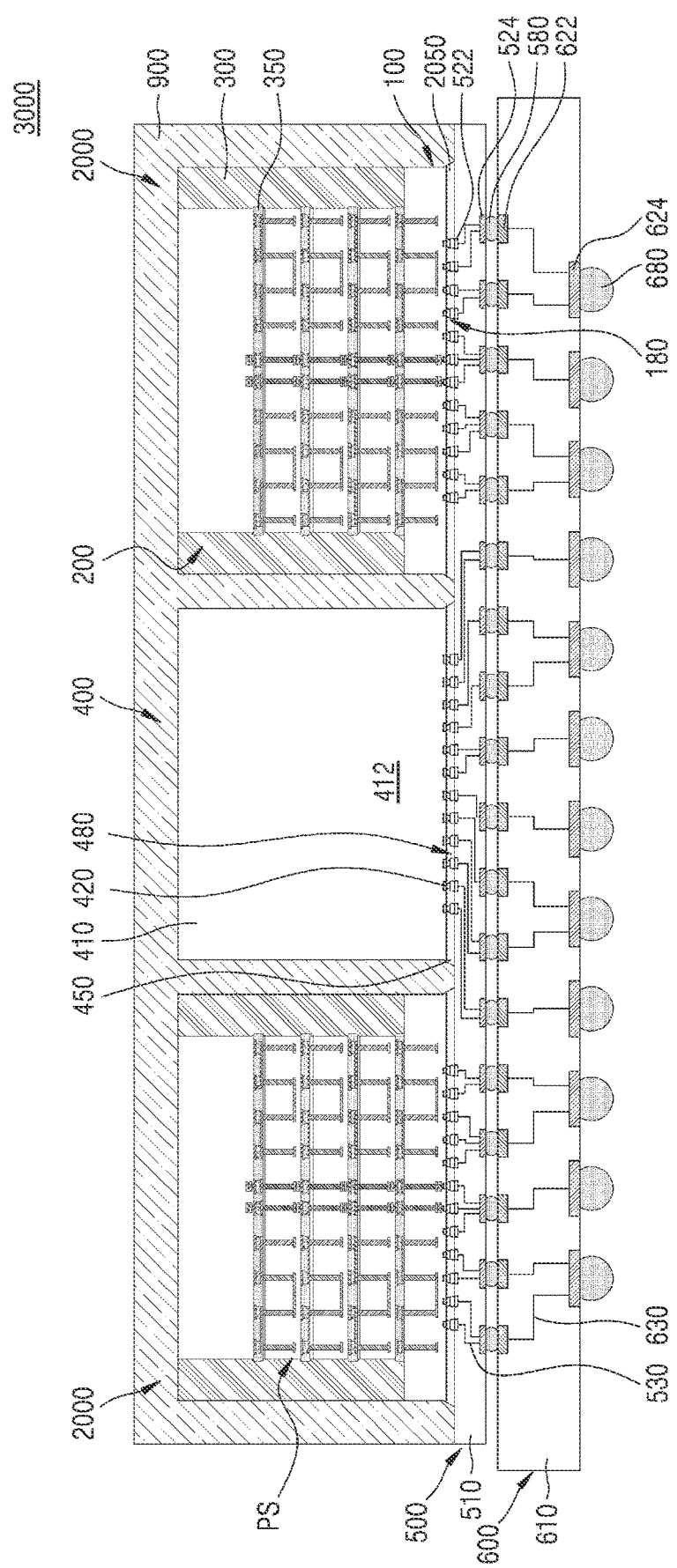
FIGS. 10 to 12 are cross-sectional views of a semiconductor package according to some embodiments of the inventive concept.
Figure 11:
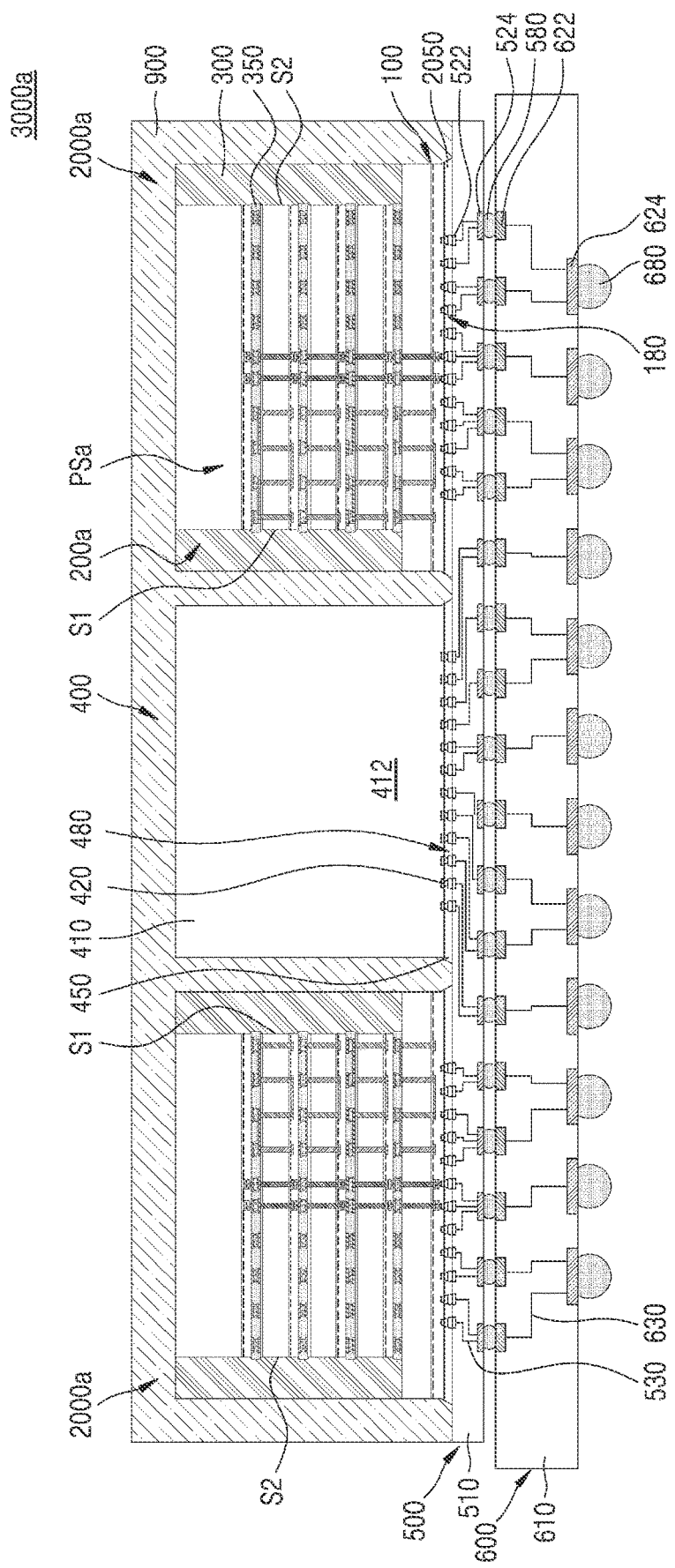
Figure 12:
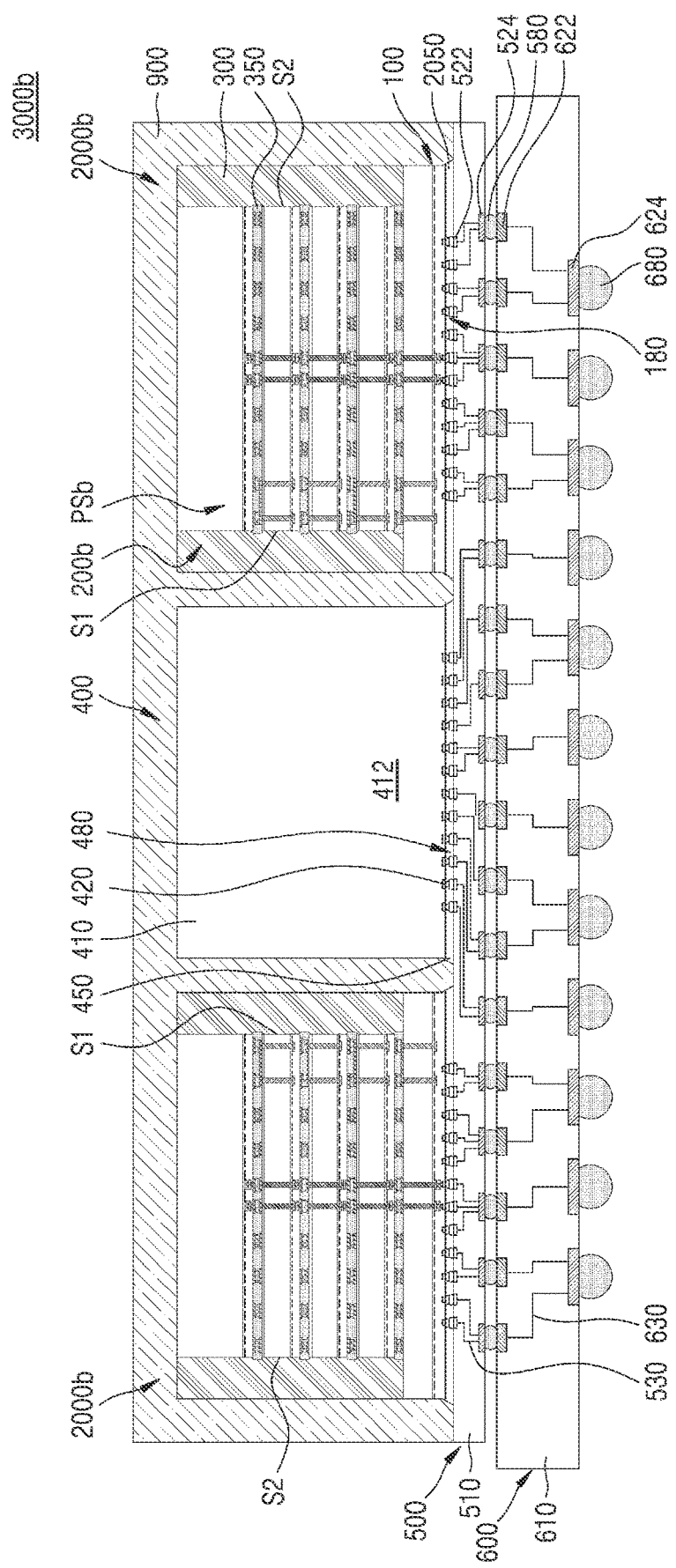

FIGS. 10 to 12 are cross-sectional views of a semiconductor package according to some embodiments of the inventive concept.

Referring to FIG. 10, a semiconductor package 3000 may include a main board 600 on which the interposer 500 is mounted, a stacked semiconductor chip structure 2000 including the first semiconductor chip 100 and the plurality of second semiconductor chips 200 apart from and attached to each other on the interposer 500, and a third semiconductor chip 400. The stacked semiconductor chip structure 2000 may be the stacked semiconductor chip structure 2000 shown in FIGS. 3A and 3B, and the stacked semiconductor chip structure 2000 will be described with reference to FIGS. 3A and 3B. Also, the semiconductor package 3000 may be referred to as a system.

The stacked semiconductor chip structure 2000 may be attached to the interposer 500 through the plurality of first connection bumps 180. The plurality of first connection bumps 180 may be electrically connected to the first wiring structure 140 of the first semiconductor chip 100. The plurality of first connection bumps 180 may provide at least one of a signal, power, or ground for the stacked semiconductor chip structure 2000.

In FIG. 10, the semiconductor package 3000 is illustrated as including two stacked semiconductor chip structures 2000, but the inventive concept is not limited thereto. For example, the semiconductor package 3000 may include one stacked semiconductor chip structure 2000, or may include three or more stacked semiconductor chip structures 2000.

The third semiconductor chip 400 may include a third semiconductor substrate 410 on which a third semiconductor device 412 is formed on an active surface, a plurality of top connection pads 420, a third front protective layer 440, and a plurality of third connection bumps 480 attached to the plurality of top connection pads 420. The third semiconductor chip 400 may be, for example, a CPU chip, a GPU chip, or an AP chip.

Because the third semiconductor substrate 410 is a component substantially the same as or similar to the first semiconductor substrate 110 or the second semiconductor substrate 210 described in FIG. 1A, the third semiconductor device 412 is a component substantially the same as or similar to the first semiconductor device 112 or the second semiconductor device 212 described in FIG. 1A, a third connection bump 480 is a component substantially the same as or similar to the first connection bump 180 or the second connection bump 280 described in FIG. 1A, and a top connection pad 420 is a component substantially the same as or similar to the first front pad 152 or the second front pad 252 described in FIG. 1A, a detailed description thereof may not be given herein.

The interposer 500 may include a base layer 510, a first upper pad 522 and a first lower pad 524 respectively on upper and lower surfaces of the base layer 510, and a first wiring path 530 electrically connecting the first upper pad 522 and the first lower pad 524 through the base layer 510. In some embodiments, the interposer 500 may be a silicon interposer. In some embodiments, the interposer 500 may be a rewiring interposer.

The base layer 510 may include, for example, a semiconductor material, glass, ceramic, and/or plastic. For example, the base layer 510 may include silicon. The first wiring path 530 may be an internal through electrode electrically connecting the first upper pad 522 to the first lower pad 524 inside a wiring layer and/or the base layer 510 connected to the first upper pad 522 and/or the first lower pad 524 on an upper surface and/or lower surface of the base layer 510. The first connection bump 180 that electrically connects the semiconductor package 3000 to the interposer 500 and the third connection bump 480 that electrically connects the third semiconductor chip 400 to the interposer 500 may be connected to the first upper pad 522.

A first underfill layer 2050 may be between the stacked semiconductor chip structure 2000 and the interposer 500, and a second underfill layer 450 may be between the third semiconductor chip 400 and the interposer 500. The first underfill layer 2050 and the second underfill layer 450 may surround the first connection bump 180 and the third connection bump 480, respectively.

The semiconductor package 3000 may further include a package molding layer 900 surrounding side surfaces of the stacked semiconductor chip structure 2000 and the third semiconductor chip 400 on the interposer 500. The package molding layer 900 may include, for example, an epoxy mold compound EMC. In some embodiments, the package molding layer 900 may cover an upper surface of the stacked semiconductor chip structure 2000 and the third semiconductor chip 400. In some embodiments, the package molding layer 900 may cover the upper surface of the stacked semiconductor chip structure 2000 and the third semiconductor chip 400. For example, a heat dissipating member may be attached on the stacked semiconductor chip structure 2000 and the third semiconductor chip 400 with a thermal interface material layer (TIM) therebetween. The thermal interface material layer may be, for example, mineral oil, grease, gap filler putty, phase change gel, phase change material pads, and/or particle filled epoxy. The heat member may be, for example, a heat sink, a heat spreader, a heat pipe, and/or a liquid cooled cold plate.

A board connection terminal 580 may be attached on the first lower surface pad 524. A board connection terminal 540 may electrically connect the interposer 500 to the main board 600.

The main board 600 may include a base board layer 610, a second upper pad 622 and a second lower pad 624 respectively arranged on upper and lower surfaces of the base board layer 610, and a second wiring path 630 electrically connecting the second upper pad 622 to the second lower surface pad 624 through the base board layer 610.

In some embodiments, the main board 600 may be a printed circuit board. For example, the main board 600 may be a multi-layer printed circuit board. The base board layer 610 may include phenol resin, epoxy resin, and/or polyimide.

A solder resist layer (not shown) exposing the second upper pad 622 and the second lower pad 624 may be formed on the upper and lower surfaces of the base board layer 610, respectively. The board connection terminal 580 may be connected to the second upper pad 622, and an external connection terminal 680 may be connected to the second lower pad 624. The board connection terminal 580 may electrically connect between the first lower surface pad 524 and the second upper surface pad 622. The external connection terminal 680 connected to the second lower surface pad 624 may connect the semiconductor package 3000 to the outside (e.g., an external device).

In some embodiments, the semiconductor package 3000 does not include the main board 600, and the board connection terminal 580 of the interposer 500 may function as an external connection terminal.

In the semiconductor package 3000, heat generated from the third semiconductor chip 400 and transferred to the first semiconductor chip 100 and the plurality of second semiconductor chips 200 and heat generated from the first semiconductor chip 100 and the plurality of second semiconductor chips 200 may move from bottom to top, that is, from the first semiconductor chip 100 toward the uppermost second semiconductor chip 200 by the Peltier structures PS to be discharged to the outside through the uppermost second semiconductor chip 200.

Referring to FIG. 11, a semiconductor package 3000a may include the main board 600 on which the interposer 500 is mounted, the stacked semiconductor chip structure 2000a including the first semiconductor chip 100a and the plurality of second semiconductor chips 200a apart from and attached to each other on the interposer 500, and the third semiconductor chip 400. The stacked semiconductor chip structure 2000a may be the stacked semiconductor chip structure 2000a shown in FIG. 5, and the stacked semiconductor chip structure 2000a will be described with reference to FIG. 5.

The stacked semiconductor chip structure 2000a may be attached on the interposer 500 so that the first side surface S1 faces the third semiconductor chip 400. Each of the first semiconductor chip 100a and the second semiconductor chip 200a may include the Peltier structure PSa arranged on the first side surface S1.

In some embodiments, the semiconductor package 3000a may generate a relatively large amount of heat from the third semiconductor chip 400. In the stacked semiconductor chip structure 2000a, the semiconductor package 3000a may include the first semiconductor chip 100a and the plurality of second semiconductor chips 200a including the Peltier structure PSa adjacent to the first side surface S1 facing the third semiconductor chip 400, and thus, the heat generated from the third semiconductor chip 400 may move from bottom to top, that is, from the first semiconductor chip 100a toward the uppermost second semiconductor chip 200a by the Peltier structures PS included in the first semiconductor chip 100a and the plurality of second semiconductor chips 200a and arranged close to the third semiconductor chip 400 to be discharged to the outside through the uppermost second semiconductor chip 200a.

Referring to FIG. 12, a semiconductor package 3000b may include the main board 600 on which the interposer 500 is mounted, a stacked semiconductor chip structure 2000b including the first semiconductor chip 100b and the plurality of second semiconductor chips 200b apart from and attached to each other on the interposer 500, and the third semiconductor chip 400. The stacked semiconductor chip structure 2000b may be the stacked semiconductor chip structure 2000b shown in FIG. 7, and the stacked semiconductor chip structure 2000b will be described with reference to FIG. 7.

The stacked semiconductor chip structure 2000b may be attached on the interposer 500 so that the first side surface S1 faces the third semiconductor chip 400. Each of the first semiconductor chip 100b and the second semiconductor chip 200b may include the Peltier structure PSb arranged adjacent to the first side surface S1.

In some embodiments, the semiconductor package 3000b may generate a relatively large amount of heat from the third semiconductor chip 400. In the stacked semiconductor chip structure 2000b, the semiconductor package 3000b includes the first semiconductor chip 100b and the plurality of second semiconductor chips 200b including the Peltier structure PSb arranged adjacent to the first side surface S1 facing the third semiconductor chip 400, and thus, heat generated from the third semiconductor chip 400 may move from bottom to top, that is, from the first semiconductor chip 100b toward the uppermost second semiconductor chip 200b by the Peltier structures PS included in the first semiconductor chip 100b and the plurality of second semiconductor chips 200b and arranged close to the third semiconductor chip 400 to be discharged to the outside through the uppermost second semiconductor chip 200b.

While the inventive concept has been described with reference to some example embodiments thereof, it will be understood that various changes in form and details may be made therein without departing from the scope of the following claims.

What is claimed is:

1. A semiconductor chip comprising:
a semiconductor substrate;
a protective layer extending on a first surface of the semiconductor substrate;
a plurality of through electrodes extending through the semiconductor substrate and the protective layer; and
a Peltier structure including:
a plurality of first through structures including first impurities having a first conductivity type and a plurality of second through structures including second impurities having a second conductivity type that is different from the first conductivity type, the plurality of first through structures and the plurality of second through structures extending through the semiconductor substrate and the protective layer;
a plurality of first connection wires connecting respective first ends of the plurality of first through structures to respective first ends of the plurality of second through structures; and
a plurality of second connection wires connecting respective second ends of the plurality of first through structures to respective second ends of the plurality of second through structures,
wherein the plurality of first through structures and the plurality of second through structures are alternately connected to each other in series by the plurality of first connection wires and the plurality of second connection wires.

2. The semiconductor chip of claim 1, further comprising a wiring structure on a second surface of the semiconductor substrate and including a plurality of wiring patterns sequentially stacked on the second surface of the semiconductor substrate,
wherein the plurality of wiring patterns includes a first wiring pattern that is closest to the second surface of the semiconductor substrate, and
the plurality of first connection wires and the first wiring pattern are spaced apart from the second surface of the semiconductor substrate by an equal distance.

3. The semiconductor chip of claim 2, further comprising a front end of line (FEOL) layer and a back end of line (BEOL) layer sequentially stacked on the second surface of the semiconductor substrate, the BEOL layer including the wiring structure,
wherein the plurality of through electrodes extend through the FEOL layer and are connected to the wiring structure, and the plurality of first through structures and the plurality of second through structures extend through the FEOL layer.

4. The semiconductor chip of claim 1, further comprising a plurality of pads connected to the plurality of through electrodes, respectively,
wherein the protective layer extends between the plurality of pads and the first surface of the semiconductor substrate, and
the plurality of second connection wires and the plurality of pads are spaced apart from the first surface of the semiconductor substrate by an equal distance.

5. The semiconductor chip of claim 1, wherein the plurality of first through structures and the plurality of second through structures are alternately arranged in a first horizontal direction and a second horizontal direction that is perpendicular to the first horizontal direction.

6. A stacked semiconductor chip structure comprising:
a first semiconductor chip; and
a second semiconductor chip on the first semiconductor chip,
wherein each of the first semiconductor chip and the second semiconductor chip includes:
a semiconductor substrate;
a protective layer extending on a first surface of the semiconductor substrate;
a plurality of through electrodes extending through the semiconductor substrate and the protective layer; and
a Peltier structure including:
a plurality of first through structures including first impurities having a first conductivity type and a plurality of second through structures including second impurities having a second conductivity type that is different from the first conductivity type, the plurality of first through structures and the plurality of second through structures extending through the semiconductor substrate and the protective layer;

a plurality of first connection wires connecting respective first ends of the plurality of first through structures to respective first ends of the plurality of second through structures; and a plurality of second connection wires connecting respective second ends of the plurality of first through structures to respective second ends of the plurality of second through structures, wherein the plurality of first through structures and the plurality of second through structures are alternately connected to each other in series by the plurality of first connection wires and the plurality of second connection wires, and the Peltier structure of the first semiconductor chip and the Peltier structure of the second semiconductor chip are connected in parallel to each other.

7. The stacked semiconductor chip structure of claim 6, wherein the second semiconductor chip includes a core chip including dynamic random access memory (DRAM) memory cells, and the first semiconductor chip includes a buffer chip configured to control the second semiconductor chip.

8. The stacked semiconductor chip structure of claim 6, wherein each of the first semiconductor chip and the second semiconductor chip further comprises a front end of line (FEOL) layer and a back end of line (BEOL) layer sequentially stacked on a second surface of the semiconductor substrate, the BEOL layer includes a wiring structure including a plurality of wiring patterns that include respective first wiring patterns closest to the second surface of the semiconductor substrate, and the plurality of through electrodes extends through the FEOL layer and are connected to the first wiring patterns, respectively.

9. The stacked semiconductor chip structure of claim 8, wherein the plurality of first connection wires and the first wiring patterns include the same material and are spaced apart from the second surface of the semiconductor substrate by an equal distance.

10. The stacked semiconductor chip structure of claim 6, wherein the first semiconductor chip and the second semiconductor chip are stacked in a vertical direction, and the plurality of first through structures and the plurality of second through structures are arranged alternately in a first horizontal direction and a second horizontal direction that is perpendicular to the first horizontal direction.

11. The stacked semiconductor chip structure of claim 6, wherein each of the first semiconductor chip and the second semiconductor chip further includes a plurality of pads that are on the protective layer and connected to the plurality of through electrodes, respectively, and the plurality of second connection wires and the plurality of pads are spaced apart from the first surface of the semiconductor substrate by an equal distance.

12. The stacked semiconductor chip structure of claim 6, wherein one of the plurality of first connection wires contacts both the first end of a first one of the plurality of first through structures and the first end of a first one of the plurality of second through structures, and one of the plurality of second connection wires contacts both the second end of the first one of the plurality of first through structures and the second end of a second one of the plurality of second through structures.

13. The stacked semiconductor chip structure of claim 6, wherein the first semiconductor chip and the second semiconductor chip are stacked in a vertical direction, the plurality of through electrodes, the plurality of first through structures and the plurality of second through structures have an equal thickness in the vertical direction, and ends of the plurality of through electrodes, the first ends of the plurality of first through structures, and the first ends of the plurality of second through structures are coplanar with each other.

14. The stacked semiconductor chip structure of claim 6, wherein the second semiconductor chip comprises a plurality of cell blocks, a peripheral circuit area between the plurality of cell blocks, and a plurality of corner areas adjacent to corners of the plurality of cell blocks, and each of the plurality of first through structures and the plurality of second through structures are in a respective one of the plurality of corner areas.

15. The stacked semiconductor chip structure of claim 14, wherein the second semiconductor chip comprises a through electrode area that includes the plurality of through electrodes and is between opposing sides of the second semiconductor chip, and an entirety of each of the plurality of first through structures and the plurality of second through structures is between a first side of the opposing sides of the second semiconductor chip and the through electrode area.

16. The stacked semiconductor chip structure of claim 6, wherein the second semiconductor chip comprises a plurality of cell areas, a through electrode area, and a through structure area, the through electrode area includes the plurality of through electrodes and is between a first group and a second group of the plurality of cell areas, the first group of the plurality of cell areas is adjacent to a first side of opposing sides of the second semiconductor chip, and the second group of the plurality of cell areas is adjacent to a second side of the opposing sides of the second semiconductor chip, the through structure area includes the plurality of first through structures and the plurality of second through structures, and the through structure area is between the first side of the opposing sides of the second semiconductor chip and the first group of the plurality of cell areas.

17. The stacked semiconductor chip structure of claim 6, wherein each of the plurality of first through structures and the plurality of second through structures includes Si, Poly-Si, SiGe, $Bi_2Te_3$, GeBiTe, and/or PbTe.

18. A semiconductor package comprising:

an interposer;

a stacked semiconductor chip structure attached to a first surface of the interposer and including a first semiconductor chip and a second semiconductor chip sequentially stacked on the interposer; and a third semiconductor chip that is attached to the first surface of the interposer and spaced apart from the stacked semiconductor chip structure, wherein each of the first semiconductor chip and the second semiconductor chip includes:

a semiconductor substrate;

a protective layer extending on a first surface of the semiconductor substrate;

a front end of line (FEOL) layer on a second surface of the semiconductor substrate, the second surface of the semiconductor substrate being opposite the first surface of the semiconductor substrate;

a back end of line (BEOL) layer including a wiring structure that includes a plurality of wiring patterns, the FEOL layer extending between the second surface of the semiconductor substrate and the BEOL layer, and the plurality of wiring patterns respectively including a plurality of first wiring patterns that are closest to the semiconductor substrate;

a plurality of through electrodes extending through the FEOL layer, the semiconductor substrate, and the protective layer and including respective first ends respectively connected to the plurality of first wiring patterns;

a plurality of pads connected to respective second ends of the plurality of through electrodes, the protective layer extending between the first surface of the semiconductor substrate and the plurality of pads; and a Peltier structure including:
- a plurality of first through structures including first impurities having a first conductivity type;
- a plurality of second through structures including second impurities having a second conductivity type that is different from the first conductivity type;
- a plurality of first connection wires connecting respective first ends of the plurality of first through structures to respective first ends of the plurality of second through structures, the plurality of first connection wires and the plurality of first wiring patterns being spaced apart from the second surface of the semiconductor substrate by an equal distance; and
- a plurality of second connection wires connecting respective second ends of the plurality of first through structures to respective second ends of the plurality of second through structures, the plurality of second connection wires and the plurality of pads being spaced apart from the first surface of the semiconductor substrate by an equal distance, wherein the plurality of first through structures and the plurality of second through structures are alternately connected to each other in series by the plurality of first connection wires and the plurality of second connection wires.

19. The semiconductor package of claim 18, wherein the Peltier structures of the first semiconductor chip and the second semiconductor chip are connected in parallel to each other.

20. The semiconductor package of claim 18, wherein the second semiconductor chip includes a through electrode area that includes the plurality of through electrodes and is between opposing sides of the second semiconductor chip, and the Peltier structure of the second semiconductor chip is not between the through electrode area and one of the opposing sides of the second semiconductor chip.

* * * * *